US011068827B1

(12) United States Patent
Groce, III et al.

(10) Patent No.: US 11,068,827 B1
(45) Date of Patent: Jul. 20, 2021

(54) MASTER PERFORMANCE INDICATOR

(71) Applicant: Wells Fargo Bank, N.A., San Francisco, CA (US)

(72) Inventors: Ralph H. Groce, III, Stroudsburg, PA (US); Ryan Swanstrom, Sioux Falls, SD (US); Sean McDermott, Richmond, VA (US); Linda C. Butt, Mooresville, NC (US); Jessica Derby, Saint Louis, MN (US); Christopher Galbraith, Rapid City, SD (US); Clayton Campbell, Sammamish, WA (US)

(73) Assignee: WELLS FARGO BANK, N.A., San Francisco, CA (US)

( * ) Notice: Subject to any disclaimer, the term of this patent is extended or adjusted under 35 U.S.C. 154(b) by 735 days.

(21) Appl. No.: 15/157,797

(22) Filed: May 18, 2016

Related U.S. Application Data

(60) Provisional application No. 62/182,991, filed on Jun. 22, 2015.

(51) Int. Cl.
| | |
|---|---|
| *G06Q 10/06* | (2012.01) |
| *H04L 12/26* | (2006.01) |
| *G06F 11/36* | (2006.01) |
| *G06F 8/00* | (2018.01) |
| *G06F 11/34* | (2006.01) |
| *G06F 30/27* | (2020.01) |

(52) U.S. Cl.
CPC ......... *G06Q 10/06393* (2013.01); *G06F 8/00* (2013.01); *G06F 11/3409* (2013.01); *G06F 11/36* (2013.01); *H04L 43/18* (2013.01); *G06F 30/27* (2020.01)

(58) Field of Classification Search
CPC combination set(s) only.
See application file for complete search history.

(56) References Cited

U.S. PATENT DOCUMENTS

| | | | | |
|---|---|---|---|---|
| 5,794,011 A | * | 8/1998 | Paul | G06F 11/3419 703/22 |
| 8,005,639 B2 | * | 8/2011 | Ding | G06F 11/26 702/123 |
| 8,607,140 B1 | * | 12/2013 | Pascovici | G06F 16/958 715/229 |
| 8,793,652 B2 | * | 7/2014 | Berg | G06F 8/71 717/121 |
| 9,208,463 B1 | * | 12/2015 | Bhide | G06F 16/903 |
| 9,438,491 B1 | * | 9/2016 | Kwok | G06Q 10/06395 |
| 2002/0174000 A1 | * | 11/2002 | Katz | G06Q 10/06316 705/7.26 |

(Continued)

*Primary Examiner* — Crystol Stewart

(57) ABSTRACT

Provided is a manner of determining a performance indicator score for an entity. A method includes identifying a set of result indicators that contribute to a target result for a defined process. The set of result indicators include a first result indicator, a second result indicator, and a third result indicator. The method also includes determining a first score for the first result indicator, a second score for the second result indicator, and a third score for the third result indicator. Further, the method includes applying a first weight to the first score, a second weight to the second score, and a third weight to the third score. A master performance indicator score is determined based on a combination of the first score, the second score, and the third score as a function of the first weight, the second weight, and the third weight.

12 Claims, 12 Drawing Sheets

(56) References Cited

U.S. PATENT DOCUMENTS

| | | | |
|---|---|---|---|
| 2003/0051187 A1* | 3/2003 | Mashayekhi | G06F 11/2028 714/4.11 |
| 2006/0168170 A1* | 7/2006 | Korzeniowski | H04L 41/0604 709/223 |
| 2006/0184916 A1* | 8/2006 | Baum | G06N 20/00 717/120 |
| 2007/0074151 A1* | 3/2007 | Rivera | G06F 8/20 717/104 |
| 2007/0112607 A1* | 5/2007 | Tien | G06Q 10/00 705/7.39 |
| 2008/0163015 A1* | 7/2008 | Kagan | G06F 11/2294 714/724 |
| 2009/0216624 A1* | 8/2009 | Kato | G06F 11/3409 705/7.38 |
| 2009/0217247 A1* | 8/2009 | Kamigata | G06F 11/3612 717/131 |
| 2009/0249281 A1* | 10/2009 | Fritzsche | G06F 11/3447 717/104 |
| 2009/0313615 A1* | 12/2009 | Joshi | G06F 8/443 717/154 |
| 2010/0205124 A1* | 8/2010 | Ben-Hur | G06N 20/10 706/12 |
| 2010/0241903 A1* | 9/2010 | Goldszmidt | G06F 11/0709 714/38.14 |
| 2011/0078099 A1* | 3/2011 | Weston | G06N 20/00 706/12 |
| 2011/0231582 A1* | 9/2011 | Uysal | G06F 11/3409 710/15 |
| 2012/0110544 A1* | 5/2012 | Novak | G06F 8/20 717/101 |
| 2012/0185734 A1* | 7/2012 | Gilkerson | G06F 9/30101 714/45 |
| 2013/0031424 A1* | 1/2013 | Srivastava | G06F 11/079 714/47.2 |
| 2013/0249917 A1* | 9/2013 | Fanning | G06F 11/323 345/440 |
| 2014/0095537 A1* | 4/2014 | Park | G06F 16/2477 707/770 |
| 2014/0123110 A1* | 5/2014 | Wan | G06F 11/3672 717/124 |
| 2014/0188572 A1* | 7/2014 | Hegde | G06Q 10/06393 705/7.39 |
| 2014/0310235 A1* | 10/2014 | Chan | G06F 11/3003 707/603 |
| 2015/0026335 A1* | 1/2015 | Ladd | G06F 11/2268 709/224 |
| 2015/0186253 A1* | 7/2015 | Abraham | G06F 11/3409 717/124 |
| 2015/0355932 A1* | 12/2015 | Hiebert | G06F 9/45558 718/1 |
| 2016/0019564 A1* | 1/2016 | Ouyang | G06Q 30/0202 705/7.31 |
| 2016/0103887 A1* | 4/2016 | Fletcher | G06F 16/334 707/722 |
| 2016/0173321 A1* | 6/2016 | Gukal | H04L 41/064 709/224 |
| 2016/0364210 A1* | 12/2016 | Davidov | G06F 8/20 |
| 2017/0083572 A1* | 3/2017 | Tankersley | G06Q 10/10 |
| 2017/0371878 A1* | 12/2017 | Grigoryan | G06F 9/5072 |

* cited by examiner

400

QUALITY_RAW 402

QUALITY_RAW_ID INT PK
APPLICATION_ID STRING
FREQ_DATE DATA
DEV_EFFORT INT
TEST_EFFORT INT
SIT_DEFECTS INT
UAT_DEFECTS INT
PROD_DEFECTS INT
INSERT_DATE DATE
UPDATE_DATE DATE

AVAILABILITY_RAW 406

AVAILABILITY_RAW_ID INT PK
SERVICE_ID STRING
FREQ_DATE DATE
UPTIME FLOAT
SCHED_DOWNLTIME FLOAT
UNSCHED_DOWNTIME FLOAT
PERCENT_UPTIME FLOAT
EXPERT_PERCENT_UPTIME FLOAT
INSERT_DATE DATE
UPDATE_DATE DATE

SATISFACTION_RAW 404

SATISFACTION_RAW_ID INT PK
QUESTION_ID STRING
FREQ_DATE DATE
QUESTION_TEXT STRING
RESPONDENT_ID STRING
RESPONSE INT
RESPONSE_DATE DATE
APPLICATION_ID STRING
INSERT_DATE DATE
UPDATE_DATE DATE

SCHEDULE_RAW 408

SCHEDULE_RAW_ID INT PK
PROJECT_ID STRING
FREQ_DATE DATE
SCHED_START_DATE DATE
SCHED_FINISH_DATE DATE
ACTUAL_START_DATE DATE
ACTUAL_FINISH_DATE DATE
INSERT_DATE DATE
UPDATE_DATE DATE

REQUIREMENTS_RAW 410

REQUIREMENTS_RAW_ID INT PK
PROJECT_ID STRING
FREQ_DATE DATE
SCHED_REQ INT
ACTUAL_REQ INT INSERT_DATE DATE
UPDATE_DATE DATE

QUALITY_SCORE 502

QUALITY_SCORE_IN INT PK
APPLICATION_ID STRING
FREQ_DATE DATA
SCORE FLOAT
ACTIVE BOOLEAN
INSERT_DATE DATE
UPDATE_DATE DATE

AVAILABILITY_SCORE 506

AVAILABILITY_SCORE_ID INT PK
SERVICE_ID STRING
FREQ_DATE DATE
SCORE FLOAT
ACTIVE BOOLEAN
INSERT_DATE DATE
UPDATE_DATE DATE

SATISFACTION_SCORE 504

SATISFACTION_SCORE_ID INT PK
QUESTION_ID STRING
FREQ_DATE DATE
SCORE FLOAT
ACTIVE BOOLEAN
INSERT_DATE DATE
UPDATE_DATE DATE

SCHEDULE_SCORE 508

SCHEDULE_SCORE_ID INT PK
PROJECT_ID STRING
FREQ_DATE DATE
SCORE FLOAT
ACTIVE BOOLEAN
INSERT_DATE DATE
UPDATE_DATE DATE

REQUIREMENTS_SCORE 510

REQUIREMENTS_SCORE_ID INT PK
PROJECT_ID STRING
FREQ_DATE DATE
SCORE FLOAT
ACTIVE BOOLEAN
INSERT_DATE DATE
UPDATE_DATE DATE

FIG. 5

MASTER PERFORMANCE INDICATOR

CROSS-REFERENCE TO RELATED APPLICATIONS

This application claims the benefit of U.S. Provisional Application Ser. No. 62/182,991, filed Jun. 22, 2015, and entitled "MASTER PERFORMANCE INDICATOR," the entirety of which is expressly incorporated herein by reference.

BACKGROUND

Many organizations, including software development organizations, struggle to measure overall performance. For example, the varied number and amount of measurements used may make an overall performance measurement difficult. Further, it is difficult to compare historical performance if the same measurements are not consistent throughout the recent history of an organization.

SUMMARY

The following presents a simplified summary of the innovation in order to provide a basic understanding of some aspects of the innovation. This summary is not an extensive overview of the innovation. It is not intended to identify key/critical elements of the innovation or to delineate the scope of the innovation. Its sole purpose is to present some concepts of the innovation in a simplified form as a prelude to the more detailed description that is presented later.

Various aspects discussed herein relate to an overall performance indicator, or Master Performance Indicator (MPI), that provides a single number score (or value) to measure the performance. The MPI may statistically analyze the past performance of the organization and use that information to score the organization on its current performance. A separate MPI score may be calculated for each input element and then aggregated together to form an overall MPI score.

An aspect relates to a system that includes a processor and a memory that stores executable instructions that, when executed by the processor, facilitate performance of operations. The operations may include identifying a set of elements that contribute to a target result associated with software development. The set of elements may be related to a process and represent performance attributes. Further, the set of elements may include a first element and a second element. The operations may also include determining a first score for the first element and second score for the second element. Further, the operations may include outputting in an electronic format a predictive analysis of the target result. The predictive analysis may be represented as a single final score determined based on a combination of the first score and the second score.

Another aspect relates to a method that includes evaluating, by a system comprising a processor, a first status of a first input and a second status of a second input based on a defined interval of time. The method may also include comparing, by the system, the first status and the second status to respective historical data of the first input and the second input. Further, the method may include determining, by the system, a first score for the first input and a second score for the second input based on the comparing. The method may also include determining, by the system, a single score that represents a combination of the first score and the second score. The single score may define a performance level of a process that includes the first input and the second input.

A further aspect relates to a computer-readable storage device that stores executable instructions that, in response to execution, cause a system comprising a processor to perform operations. The operations may include identifying a set of result indicators that contribute to a target result for a defined process. The set of result indicators may include a first result indicator, a second result indicator, and a third result indicator. Further, the operations may include determining a first score for the first result indicator, a second score for the second result indicator, and a third score for the third result indicator. The operations may also include applying a first weight to the first score, a second weight to the second score, and a third weight to the third score. In addition, the operations may include determining a master performance indicator score based on a combination of the first score, the second score, and the third score as a function of the first weight, the second weight, and the third weight.

To the accomplishment of the foregoing and related ends, certain illustrative aspects of the innovation are described herein in connection with the following description and the annexed drawings. These aspects are indicative, however, of but a few of the various ways in which the principles of the innovation may be employed and the subject innovation is intended to include all such aspects and their equivalents. Other advantages and novel features of the innovation will become apparent from the following detailed description of the innovation when considered in conjunction with the drawings.

BRIEF DESCRIPTION OF THE DRAWINGS

Various non-limiting embodiments are further described with reference to the accompanying drawings in which:

FIG. 4 illustrates an example, non-limiting visual representation of tables for raw master performance indicator data that may be utilized with the disclosed aspects;

FIG. 5 illustrates example, non-limiting intermediate score tables for a master performance indicator, according to an aspect;

DETAILED DESCRIPTION

The innovation is now described with reference to the drawings. In the following description, for purposes of explanation, numerous specific details are set forth in order to provide a thorough understanding of the subject innovation. It may be evident, however, that the innovation may be practiced without these specific details. In other instances, well-known structures and devices are shown in block diagram form in order to facilitate describing the innovation.

The various aspects discussed herein provide a framework to define what measurements should be tracked and how those measurements should be reported, both of which are tailored for the organization. The framework may be configured to provide individual scores for each input (e.g., each measurement to be tracked) and aggregate those individual scores into a single number score that measures the performance of the organization or other entity being measured (simply referred to herein as "entity"). The single number score is referred to herein as a Master Performance Indicator (MPI). The various aspects discussed herein are not intended to be comparative between entities, but to measure the amount of increase or decrease a single entity exhibits across elements.

One or more aspects operate by statistically analyzing the past performance of the entity and utilizing that information to score the entity on its current performance. The scoring is consistent and easy to comprehend. According to a specific, non-limiting example, various elements associated with a performance of the entity, such as quality and availability, may be measured. Thus, a first individual score may be quantified for the quality element and a second individual score may be quantified for the availability element. The first individual score, the second individual score, and subsequent individual scores may be aggregated to form an overall MPI score. Other examples of elements that may be measured include, but are not limited to, satisfaction, schedule adherence, requirements, and other elements determined to be Key Result Indicators (KRI).

The scores for MPI may range from a first value to a second value. In an example, the first value may be −100, indicating the worst performance, and the second value may be +100, indicating perfection. A score of 0, in this example, is an indication of meeting the basic expectations (or bare minimum). Thus, according to some implementations, a negative score may indicate under-performance and a positive score may indicate over-performance. According to an example, an MPI score of 20 indicates the entity is performing 20% better than expected. Conversely, a score of −20 indicates the entity is performing 20% worse than expected. It should be understood that other scoring ranges may be utilized with the disclosed aspects.

Figure 1:
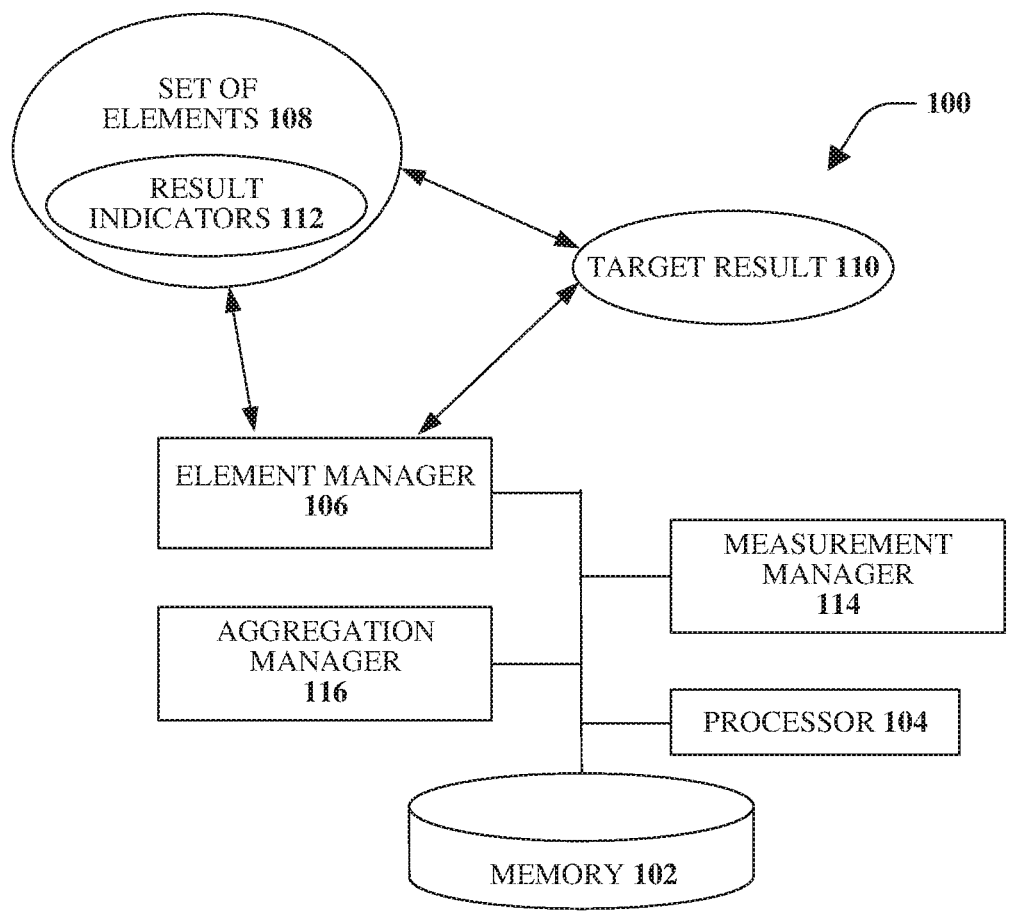
FIG. 1 illustrates an example, non-limiting system configured to determine a master performance indicator, according to an aspect.

FIG. 1 illustrates an example, non-limiting system 100 configured to determine a master performance indicator, according to an aspect. The various aspects discussed herein provide for the improvement of quality (or another factor being evaluated) for a particular business, organization, team, group, and/or processes, includes software processes.

In one example, an aspect focuses on providing a manner for performance delivery. A number of attributes (sometimes referred to as key attributes) affecting the performance delivery may be identified and acceptable ranges may be established. During each delivery, these attributes may be reiteratively measured and scored using mathematical measures and algorithms.

In additional or alternative implementations, average scores may be provided and stored for long-term statistical analysis. In some implementations, sudden drops may be indicated and corrected, substantially immediately, in areas were a quality drop severely affects delivery and/or causes alarm in data integrity. According to another implementation, a sliding scale may be provided so that each group may adjust quality over time (e.g., as quality improves in certain process or other issues impact quality negatively). In a further implementation, defect subtraction may be implemented prior to establishing a score.

The system 100 may include at least one memory 102 that may store computer executable components and/or computer executable instructions. The system 100 may also include at least one processor 104, communicatively coupled to the at least one memory 102. The at least one processor 104 may facilitate execution of the computer executable components and/or the computer executable instructions stored in the at least one memory 102. The term "coupled" or variants thereof may include various communications including, but not limited to, direct communications, indirect communications, wired communications, and/ or wireless communications.

It is noted that although the one or more computer executable components and/or computer executable instructions may be illustrated and described herein as components and/or instructions separate from the at least one memory 102 (e.g., operatively connected to the at least one memory 102), the various aspects are not limited to this implementation. Instead, in accordance with various implementations, the one or more computer executable components and/or the one or more computer executable instructions may be stored in (or integrated within) the at least one memory 102. Further, while various components and/or instructions have been illustrated as separate components and/or as separate instructions, in some implementations, multiple components and/or multiple instructions may be implemented as a single component or as a single instruction. Further, a single component and/or a single instruction may be implemented as multiple components and/or as multiple instructions without departing from the example embodiments.

Also included in the system 100 may be an element manager 106 that may be configured to identify a set of elements 108 that contribute to a target result 110. Proper measurement is necessary for improvement because without a starting point it is impossible to determine progress. Also, consistent reporting is needed for tracking historical performance.

A metric may be defined as a means of telling a complete story for the purpose of improving something. Metrics are frequently indirect measurements. Although beneficial, metrics do not tell the story of the entire entity. Metrics are good for tracking, but decision making based on the metrics alone is difficult.

Another measurement technique is indicators. An indicator is a performance measure. Indicators may be divided into four categories: result indictor, key result indicator, performance indicator, and key performance indicator. The indicators chosen by one organization might not be the same as the indicators chosen by another organization.

Result indicators describe what has been done (e.g., performance measures that summarize activity). Financial performance measures are result indicators. Result indicators are measured on a timely basis (e.g., daily, weekly, monthly) and are the result of more than one activity. They do not indicate what needs to be accomplished to improve the result indictor.

Key result indicators describe how you have done. Thus, key result indicators are measures of multiple activities that provide a clear picture of whether the entity is heading in the right direction. Key result indicators should not be confused with key performance indicators, which will be discussed below. Key result indicators do not tell an entity what is needed to improve the results. They are beneficial for high-level management but not necessarily beneficial for the working staff.

Performance indicators describe what you do and are non-financial performance indicators that help a team align themselves with the organization strategy. Performance indicators may be important to the entity's success, but are not the key measures that will lead to drastic improvement. Performance indicators are specifically tied to a team and the staff understand what actions should be taken to improve the performance indicator.

Key performance indicators describe how to dramatically increase performance (e.g., the action required to improve the measure). Key performance indicators are performance measures that focus on critical aspects for current and future success of the entity. It is noted that key performance indicators are not focused on historical performance, and they clearly indicate how to drastically increase performance. Key performance indicators allow a team to monitor current performance and quickly take action to correct future performance. Key performance indicators cover a shorter time frame than key result indicators. Key performance indicators have at least the following characteristics: not financial, measured frequency (e.g., hourly, daily, weekly); acted on by upper-level management; clearly indicate the action required; tie responsibility to a particular team; have a significant impact; and encourage appropriate action.

The performance indicators and key performance indicators are not the correct indictors to utilize to determine the final score (e.g., MPI score), since key performance indicators are targeted towards immediate action and future performance. Instead, to obtain a single value as an indicator of performance, the result indicators and key result indicators are useful. Thus, the set of elements 108 may include key result indicators 112. Examples of key result indicators for a software development company may include, but are not limited to, "customer satisfaction," "net profit," "money spent on fixing software," "percentage of new features versus fixes," "time on website," "percentage of servers meeting the expected availability," and so on.

A measurement manager 114 may be configured to determine scores for each element in the set of elements 108. For example, the set of elements may include a first element and at least a second element. Therefore, the measurement manager 114 may determine a first score for the first element and at least a second score for the second element. In an implementation, the measurement manager 114 may determine the score based on inputs that indicate an acceptable range for a particular element in the set of elements 108. As the process is being evaluated, the measurement manager 114 may be configured to score each element of the set of elements based on what is actually occurring at the time of the evaluation.

An aggregation manager 116 may be configured to determine a single final score for the target result 110 based on the scores for each element in the set of elements 108 (e.g., as determined by the measurement manager 114). Updated individual scores and final scores may be calculated based on a selectable interval (e.g., weekly, monthly, quarterly, and so on). According to some implementations, the scores for each element may be weighted when determining the single final score, which will be discussed in further detail below.

Figure 2:
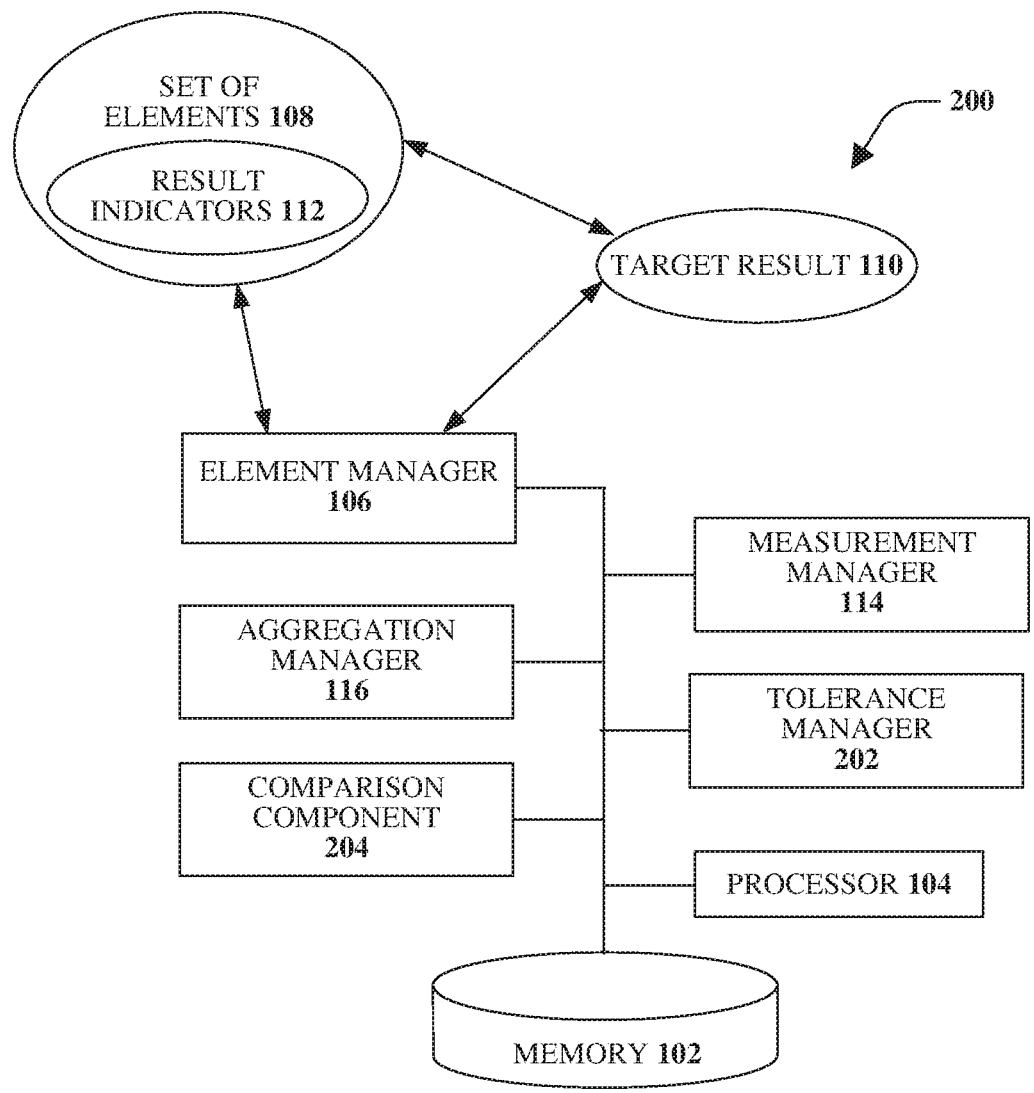
FIG. 2 illustrates an example, non-limiting system for improving quality for an identified process, according to an aspect.

FIG. 2 illustrates an example, non-limiting system 200 for improving quality for an identified process, according to an aspect. A single number score that indicates an overall performance of an organization (e.g., an entity) or a particular department or process of the organization is created according to one or more aspects.

The system 200 may include a tolerance manager 202 that may be configured to determine respective tolerances for the elements included in the set of elements 108. For example, a first tolerance may be determined for a first element and at least a second tolerance may be determined for at least a second element. The tolerances may be determined by the tolerance manager 202 based on various rules and/or policies of the entity. According to some implementations, the tolerances may be determined based on historical data, goals of the entity, a percentage change relative to a current performance level, and so on.

The tolerance manager 202 may provide a range of values that indicate conformance to an acceptable level of tolerance for each element. For example, the scores may range from −1, indicating the worst performance, all the way to +1, indicating perfection. In this example, a score of 0 is an indication of meeting the basic expectations. A negative score indicates worse-than-expected performance and a positive score indicates better-than-expected performance. For example, a score of 0.35 means the entity is performing 35% better than expected. Conversely, a score of −0.15 means an entity is performing 15% worse than expected.

Some attributes for the scoring that may be used by the tolerance manager 202 may include a criteria that the range of scores should have equal values above and below 0 (e.g., +25, −25; +40, −40, and so on). Another attribute may be that the minimum score equates to the worst possible performance, as defined by the entity. A further attribute may be that the maximum score equates to the best possible performance, as defined by the entity. Another attribute may be that a score of 0 should be average (or expected) performance, as defined by the entity. Yet another attribute may be that all individual elements should have the same scoring range.

Provided the attributes, as defined by the entity, are satisfied, the range of scores may be any range. The range of [−1, 1] was discussed because it is easy to scale to a different range such as [−10, 10] or [−100, 100]. Thus scaling may be applied to obtain values in any appropriate range. The scaling factor is denoted with the variable k. Further, the scale should be the same for all elements included in the set of elements 108.

The system 200 may also include a comparison component 204 that may be configured to compare the first score with the first tolerance, the second score to the second tolerance, and subsequent scores to subsequent tolerances. This comparison may be utilized to provide a notification if the process being evaluated is expected to achieve the target result or if something should be changed in order for the target result to be achieved.

For example, the measurement manager 114 may be configured to evaluate a current performance of an entity (e.g., a process (or sub-process) being performed by employees of the entity). Various input elements may be predefined, wherein each of the input elements contribute to the target result 110. Based on the score determined by the measurement manager 114, the comparison component 204 may make a determination whether the performance is the same as, or different than, a historical performance level or target score. According to some implementations, the determination may be made individually for each input element. Additionally or alternatively, the determination may be made based on the single total score.

If the determination is that the performance is the same as, or worse than, a historical score and/or a target score, an indication may be output to provide a notification that the process being evaluated is failing. For example, if the evaluation is performed monthly, at the middle of the month (or at another point during the month) an interim score may be calculated and the results presented to one or more users (e.g., employees of the entity). If the performance is below a target score, or is expected to be below the target score at the end of the month, an indication may be provided so that the process (or group) being evaluated may make changes before the end of the month. If the determination is that the target result is expected to be achieved, an indication may be provided so that the users know to keep up the good work and not change what they are doing.

Figure 3:
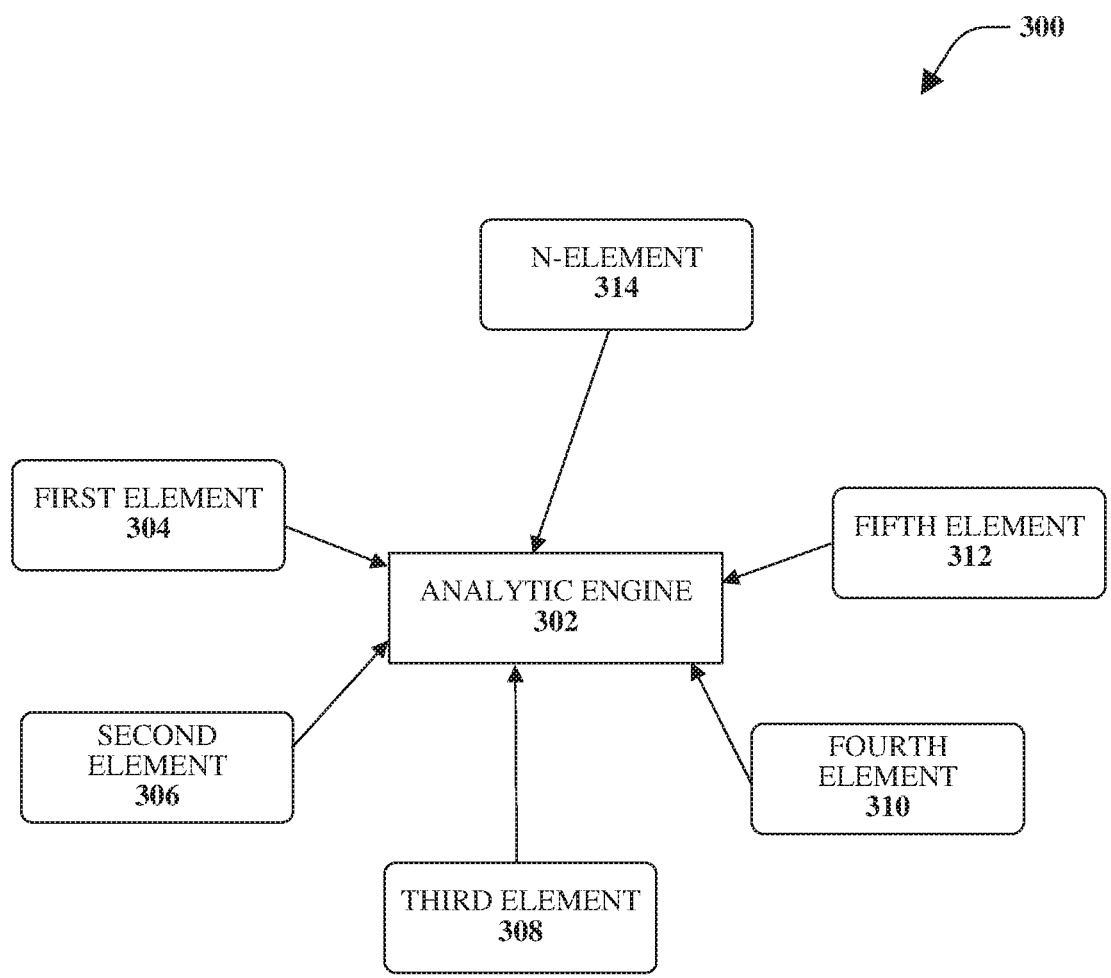
FIG. 3 illustrates an example, non-limiting representation of a data storage system, according to an aspect.

FIG. 3 illustrates an example, non-limiting representation of a data storage system 300, according to an aspect. In order for the various aspects discussed herein to properly track the elements that are used for input to the element manager 106, the data storage system 300 may be configured to store the appropriate data. The data storage system 300 should be configured to avoid the problem of inaccurate data caused by numerous manipulations of the existing data while allowing limited changes to the existing data.

Included in the data storage system 300 may be an analytic engine 302. The analytic engine 302 does not specify how the data is entered. Instead, the analytic engine 302 specifies how the data is stored. A set of elements may be inputs to the analytic engine 302. As illustrated, there is a first element 304, a second element 306, a third element 308, a fourth element 310, a fifth element 312, through an N-element 314, where N is an integer. It is noted that although a specific number of elements are illustrated and described, the disclosed aspects are not limited to this implementation and fewer or more elements (e.g., inputs) may be utilized with the disclosed aspects.

By collecting all the data at a single location, such as at the analytic engine 302, analytics (e.g., software analytics) may be easier to create and gamification may be more easily attainable. Gamification refers to the process of making activities to be more like a game. Benefits of gamification include higher productivity, added competition, and greater enjoyment. It is noted that the master performance indicator, as discussed herein, is one possible application of the data storage system 300.

The data necessary to determine the master performance indicator should be stored in a database, such as the analytic engine 302. The following will discuss structure for example tables and relationships to store the data in a relational database. Although some of the aspects are discussed with respect to a Structured Query Language (SQL) database, the disclosed aspects may be applied to operate with other databases. SQL is a programming language designed for managing data in a relational database management system. Further, although the SQL is provided for an Oracle database, the scripts may be modified to operate with other databases such as, but not limited to, PostgreSQL, SQL Server, MySQL, and so on.

A first set of tables that should be created are tables that store the raw data that is collected. These tables match up with the necessary data for each of the elements (e.g., the set of elements 108 of FIG. 1). FIG. 4 illustrates an example, non-limiting visual representation of tables for raw master performance indicator data that may be utilized with the disclosed aspects. For purposes of discussion, the first element 304 relates to quality, the second element 306 relates to satisfaction, the third element 308 relates to availability, the fourth element 310 relates to schedule, and the fifth element 312 relates to requirements.

As illustrated in FIG. 4, the tables have no relationship with each other since the tables contain raw data. A goal of these tables is to store the raw data in a single location. Illustrated are a first raw table 402 (e.g., QUALITY_RAW), a second raw table 404 (e.g., SATISFACTION_RAW), a third raw table 406 (e.g., AVAILABILITY_RAW), a fourth raw table 408 (e.g., SCHEDULE_RAW), and a fifth raw table 410, (e.g., REQUIREMENTS_RAW). As discussed these table names match to the example elements discussed in the above paragraph with respect to FIG. 3. The following provides example SQL statements that may be utilized to create the database tables for storing the raw data.

```
- - create the raw data tables
CREATE TABLE QUALITY RAW (
   QUALITY RAW ID RAW(16) NOT NULL PRIMARY
      KEY,
   APPLICATION ID VARCHAR2(64) NOT NULL,
   FREQ DATE DATE NOT NULL,
   DEV EFFORT NUMBER(10,0) NOT NULL,
   TEST EFFORT NUMBER(10,0),
   SIT DEFECTS NUMBER(10,0),
   UAT DEFECTS NUMBER(10,0),
   PROD DEFECTS NUMBER(10,0) NOT NULL,
   INSERT DATE DATE DEFAULT SYSDATE NOT
      NULL,
   UPDATE DATE DATE DEFAULT SYSDATE NOT
      NULL)
);
CREATE TABLE AVAILABILITY RAW (
   AVAILABILITY RAW ID RAW(16) NOT NULL PRI-
      MARY KEY,
   SERVICE ID VARCHAR2(64) NOT NULL,
   FREQ DATE DATE NOT NULL
   UPTIME NUMBER(10, 5)
   SCHED DOWNTIME NUMBER(10, 5),
   UNSCHED DOWNTIME NUMBER(10, 5),
   PERCENT UPTIME NUMBER(10,5) NOT NULL,
   EXPECT PERCENT UPTIME NUMBER(10,5) NOT
      NULL,
   INSERT DATE DATE DEFAULT SYSDATE NOT
      NULL,
   UPDATE DATE DATE DEFAULT SYSDATE NOT
      NULL)
);
CREATE TABLE SATISFACTION RAW (
   SATISFACTION RAW ID RAW(16) NOT NULL PRI-
      MARY KEY,
   QUESTION ID VARCHAR2(64) NOT NULL,
   FREQ DATE DATE NOT NULL,
   QUESTION TEXT VARCHAR2(1024),
   RESPONDENT ID VARCHAR2(128),
   RESPONSE NUMBER(5,0) NOT NULL,
   RESPONSE DATE DATE,
   APPLICATION ID VARCHAR2(64),
   INSERT DATE DATE DEFAULT SYSDATE NOT
      NULL,
   UPDATE DATE DATE DEFAULT SYSDATE NOT
      NULL)
```

```
);
CREATE TABLE SCHEDULE RAW
   SCHEDULE RAW ID RAW(16) NOT NULL PRIMARY
      KEY,
   PROJECT ID VARCHAR2(64),
   FREQ DATE DATE NOT NULL,
   SCHED START DATE DATE NOT NULL,
   SCHED FINISH DATE DATE NOT NULL,
   ACTUAL START DATE DATE,
   ACTUAL FINISH DATE DATE NOT NULL,
   INSERT DATE DATE DEFAULT SYSDATE NOT
      NULL,
   UPDATE DATE DATE DEFAULT SYSDATE NOT
      NULL)
);
CREATE TABLE REQUIREMENTS RAW (
   REQUIREMENTS RAW ID RAW(16) NOT NULL PRI-
      MARY KEY,
   PROJECT ID VARCHAR2(64),
   FREQ DATE DATE NOT NULL,
   SCHED REQ NUMBER(10,0) NOT NULL,
   ACTUAL REQ NUMBER(10, 0) NOT NULL,
   INSERT DATE DATE DEFAULT SYSDATE NOT
      NULL,
   UPDATE DATE DATE DEFAULT SYSDATE NOT
      NULL)
);
- - remove the raw tables
- - DROP TABLE QUALITY RAW;
- - DROP TABLE AVAILABILITY RAW;
- - DROP TABLE SATISFACTION RAW;
- - DROP TABLE SCHEDULE RAW;
- - DROP TABLE REQUIREMENTS RAW;
```

FIG. 5 illustrates example, non-limiting intermediate score tables for a master performance indicator, according to an aspect. Illustrated are a first intermediate table 502, which corresponds to the first raw table 402. A second intermediate table 504 corresponds to the second raw table 404; a third intermediate table 506 corresponds to the third raw table 406, a fourth intermediate table 508 corresponds to the fourth raw table 408; and a fifth intermediate table 510 corresponds to the fifth raw table 410.

The intermediate tables hold the elements scores at the application id, service_id, and project_id level. Similar to the raw tables, the intermediate tables lack relationships between each other because, at this point, the element scores are still being treated independently. The following provides example, SQL statements to create the database tables for storing the intermediate MPI scores.

```
- - Create the scoring tables
CREATE TABLE QUALITY SCORE (
   QUALITY SCORE ID RAW(16) NOT NULL PRIMARY
      KEY,
   APPLICATION ID VARCHAR2(64) NOT NULL,
   FREQ DATE DATE NOT NULL,
   SCORE NUMBER(10,5) NOT NULL,
   ACTIVE CHAR DEFAULT 'Y' NOT NULL,
   INSERT DATE DATE DEFAULT SYSDATE NOT
      NULL,
   UPDATE DATE DATE DEFAULT SYSDATE NOT
      NULL)
);
CREATE TABLE AVAILABILITY SCORE (
   AVAILABILITY SCORE ID RAW(16) NOT NULL PRI-
      MARY KEY,
   SERVICE ID VARCHAR2(64) NOT NULL,
   FREQ DATE DATE NOT NULL,
   SCORE NUMBER(10,5) NOT NULL,
   ACTIVE CHAR DEFAULT 'Y' NOT NULL,
   INSERT DATE DATE DEFAULT SYSDATE NOT
      NULL,
   UPDATE DATE DATE DEFAULT SYSDATE NOT
      NULL)
);
CREATE TABLE SATISFACTION SCORE (
   AVAILABILITY SCORE ID RAW(16) NOT NULL PRI-
      MARY KEY,
   QUESTION ID VARCHAR2(64) NOT NULL,
   FREQ DATE DATE NOT NULL,
   SCORE NUMBER(10,5) NOT NULL,
   ACTIVE CHAR DEFAULT 'Y' NOT NULL,
   INSERT DATE DATE DEFAULT SYSDATE NOT
      NULL,
   UPDATE DATE DATE DEFAULT SYSDATE NOT
      NULL)
);
CREATE TABLE SCHEDULE SCORE (
   QUALITY SCORE ID RAW(16) NOT NULL PRIMARY
      KEY,
   PROJECT ID VARCHAR2(64) NOT NULL,
   FREQ DATE DATE NOT NULL,
   SCORE NUMBER(10,5) NOT NULL,
   ACTIVE CHAR DEFAULT 'Y' NOT NULL,
   INSERT DATE DATE DEFAULT SYSDATE NOT
      NULL,
   UPDATE DATE DATE DEFAULT SYSDATE NOT
      NULL)
);
CREATE TABLE REQUIREMENTS SCORE (
   REQUIREMENTS SCORE ID RAW(16) NOT NULL
      PRIMARY KEY,
   PROJECT ID VARCHAR2(64) NOT NULL,
   FREQ DATE DATE NOT NULL,
   SCORE NUMBER(10,5) NOT NULL,
   ACTIVE CHAR DEFAULT 'Y' NOT NULL,
   INSERT DATE DATE DEFAULT SYSDATE NOT
      NULL,
   UPDATE DATE DATE DEFAULT SYSDATE NOT
      NULL
);
- - remove the scoring tables
- - DROP TABLE QUALITY SCORE;
- - DROP TABLE AVAILABILITY SCORE;
- - DROP TABLE SATISFACTION SCORE;
- - DROP TABLE SCHEDULE SCORE;
- - DROP TABLE REQUIREMENTS SCORE;
```

Figure 6:
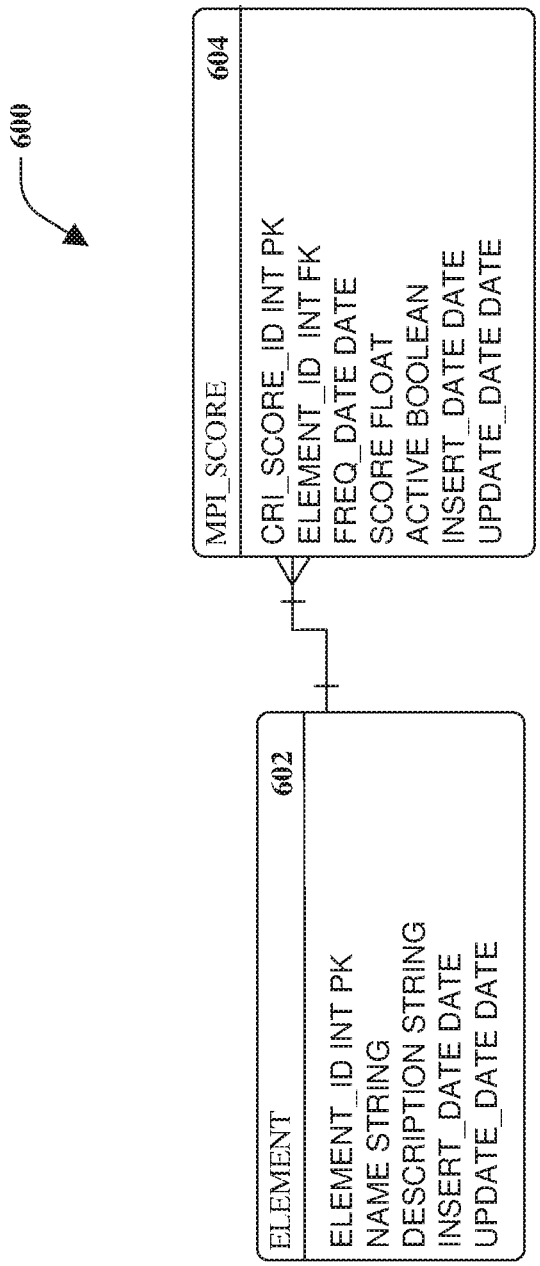
FIG. 6 illustrates example, non-limiting final score tables for master performance indicator, according to an aspect.

FIG. 6 illustrates example, non-limiting final score tables 600 for master performance indicator, according to an aspect. The final score tables include two tables. In this example, a first table 602 is an element table and the second table 604 is a MPI_SCORE table. The first table 602 stores the MPI element (e.g., quality, availability, satisfaction, schedule, requirements, overall) and an optional description. The second table 604 stores all the final elements scores and the overall MPI score. The second table 604 is related to the first table 602 as illustrated by the visual representation of the relationship between the two tables.

The following are example SQL statements to create the database tables for storing the final scores for each element and the overall MPI scores for each time frequency.

```
- - create the ELEMENT table
CREATE TABLE ELEMENT (
   ELEMENT ID NUMBER(10,0) NOT NULL PRIMARY
      KEY,
```

```
    NAME VARCHAR2(64) NOT NULL,
    DESCRIPTION VARCHAR(255),
    INSERT DATE DATE DEFAULT SYSDATE NOT
      NULL,
    UPDATE DATE DATE DEFAULT SYSDATE NOT
      NULL)
);
- - Add the MPI score types to the table
INSERT INTO ELEMENT (ELEMENT_ID,NAME)
    VALUES (1, 'QUALITY');
INSERT INTO ELEMENT (ELEMENT_ID,NAME)
    VALUES (2, 'AVAILABILITY');
INSERT INTO ELEMENT (ELEMENT_ID,NAME)
    VALUES (3, 'SATISFACTION');
INSERT INTO ELEMENT (ELEMENT_ID,NAME)
    VALUES (4, 'SCHEDULE');
INSERT INTO ELEMENT (ELEMENT_ID,NAME)
    VALUES (5, 'REQUIREMENTS');
INSERT INTO ELEMENT (ELEMENT_ID,NAME)
    VALUES (6, 'OVERALL');
- - create the overall score table
CREATE TABLE MPI SCORE (
    MPI SCORE ID RAW(16) NOT NULL PRIMARY KEY,
    ELEMENT ID NUMBER(10,0) NOT NULL REFER-
      ENCES ELEMENT( ELEMENT ID),
    FREQ DATE DATE NOT NULL,
    SCORE NUMBER(10,5) NOT NULL,
    ACTIVE CHAR DEFAULT 'Y' NOT NULL,
    INSERT DATE DATE DEFAULT SYSDATE NOT
      NULL,
    UPDATE DATE DATE DEFAULT SYSDATE NOT
      NULL)
);
- - remove ELEMENT table
- - DROP TABLE MPI SCORE;
- - DROP TABLE ELEMENT;
```

Figure 7:
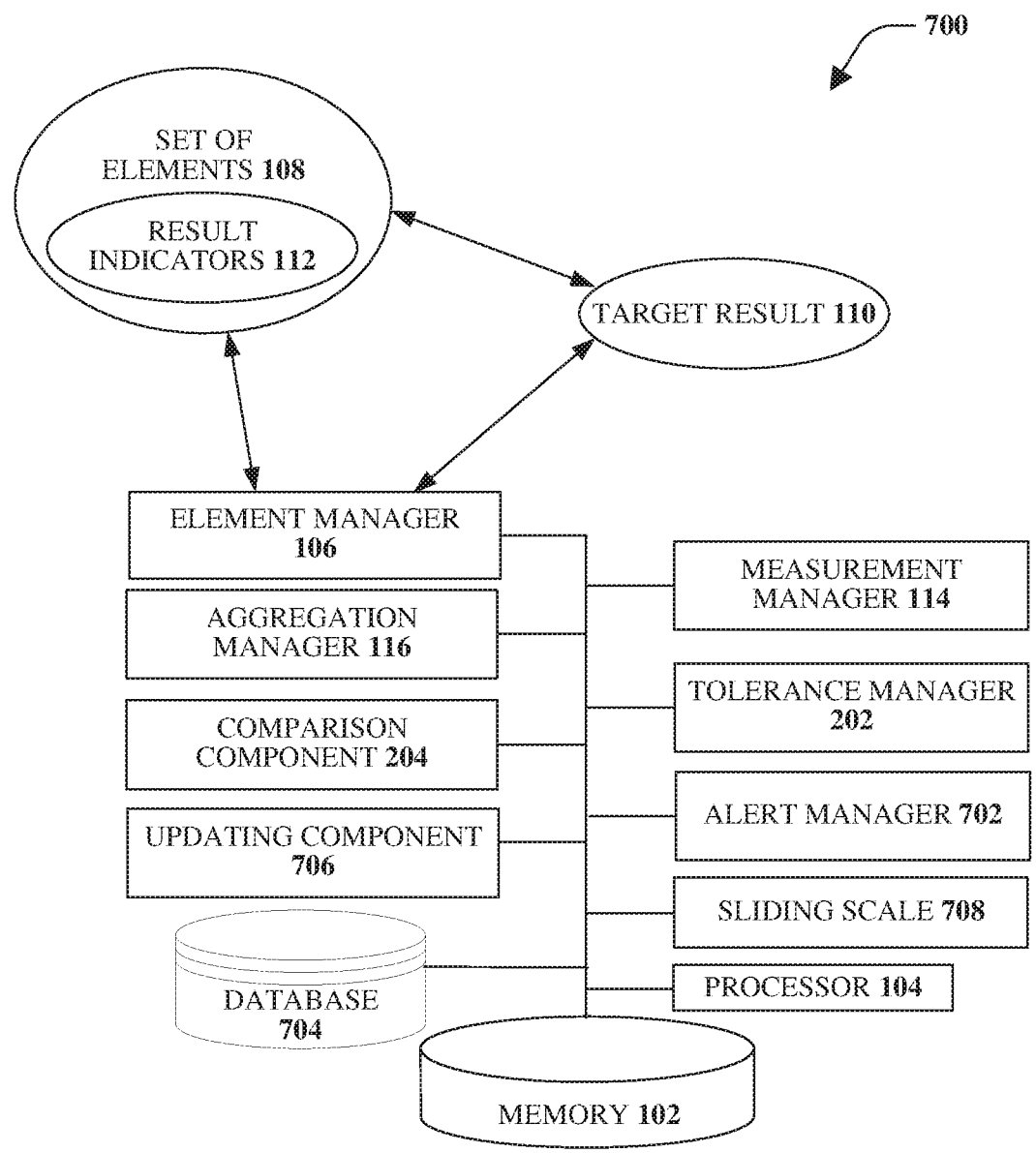
FIG. 7 illustrates an example, non-limiting system for providing a single score for multiple elements to evaluate a process, according to an aspect.

FIG. 7 illustrates an example, non-limiting system 700 for providing a single score for multiple elements to evaluate a process, according to an aspect. The various aspects provided herein facilitate quality improvement of one or more processes. An aspect relates to facilitating performance delivery (e.g., the target result 110) and allows expectations to be adjusted accordingly over time or in view anticipated delays and/or issues. A number of attributes that may affect performance delivery are identified (e.g., by the element manager 106) and acceptable ranges are established (e.g., by the measurement manager 114 or tolerance manager 202). An acceptable score is then calculated for each attribute based on a number of different parameters. According to an implementation, the parameters may be used in one or more formulas and/or algorithms to establish a final score. The calculated score may be measured for each attribute against a threshold.

An alert manager 702 may be configured to output an alert if the score is below a predefined threshold, or is projected to fall below the predefined threshold (e.g., at an end of the month as measured at about the middle of the month). According to some implementations, a second threshold may be calculated. The second threshold may establish a ceiling score and if the calculated score measures above the ceiling score, the alert manager 702 may generate a second alert. The second alert may be the same as the first alert, or may be distinguished from the first alert.

In some cases a high score may not necessarily mean exceptional performance but instead may be indicative of a flaw (e.g., the process was conducted too quickly to catch defects, the process somehow overlooked a key aspect and finished too quickly, and so on). If an expected delay or defect is known, the thresholds may be adjusted so that an alert will not be generated in such cases. Once the attributes are scored, a score card may be generated and stored. In an implementation, the scores may be averaged to provide overall scores for each attribute over time and/or for the entire process including all attributes taken together as a single (composite) unit.

Measuring quality is a part of accessing software development results. Poor quality means time, money, and resources are spent fixing the problems. One of the indicators of software quality may be problem tickets. A problem ticket is a user-reported (or customer-reported) issue with the software. Thus, it may be beneficial to measure the number of tickets associated with a software release. However, according to some implementations, the number of defects may be measured. The following is an algorithm to calculate the quality score of software being released.

According to some implementations, once the data-points for each attribute are generated, a database 704 may be established. A baseline data point may also be established that is comprised of either real data points or "to be expected" data points. This data may be used to establish past defects so that each new set of data points are then compared to previous results. This process may be utilized to identify processes that fail each time and fix the process. Additionally or alternatively, this process may be utilized to take the defects out of the calculation (or adjust for them as a known defect). In each case, the defect encountered may be measured against the previous data points and acceptable averages and/or new thresholds may be established. Statistical analysis may then be provided for each run to determine how each point is being measured over time. For example, points may be compared to see if the points go above or fall below one or more previous points. In one embodiment, all or a subset of defects may then be subtracted. In addition, the severity of the defect may be determined and, as needed, alerts may be generated (a single critical defect will need an immediate alert versus numerous non-critical defects that may not have any impact even though the number of defects generated in later case is five times the earlier one).

The database 704 may be used for statistical purposes so that progress of each group over time may be measured. It may also be used to compare processes across different groups. This may allow expectations to be adjusted over time as groups get better at performing different tasks. This may allow new thresholds (that are above or below previous ones) to be established. There might also be a possibility of having different levels of thresholds such that one level indicates measures are falling below an aspired level and the second set indicting levels that should trigger an alert (such as fatal errors and critical failures). In one embodiment, even when there is no threshold breach, a falling score in one area may allow the process to detect, notify, and fix a problem. In addition, in one embodiment, thresholds may also be set for the number of errors in one area. For example if a reiterative measure determines that feature X has received a falling score three times in a row (in three different runs), then another form of alert may be generated. Scores and thresholds, in one embodiment, may be measured against a standard deviation.

The various aspects may also incorporate an automatic updating component 706. The automatic updating component 706 may be used, for example, in updating thresholds on a periodic basis (once a month) or in cases where other adjustments are needed. However, real-time adjustments are also allowed.

In one embodiment, a sliding scale 708 may also be reiteratively provided for delivery so that the expectations for performance grows (asymptotically in one case—such that zero indicates doing your job versus 10 being unattainable). The sliding scale 708 may be then adjusted—so that an expected result may be 3 one year and over time be moved up to 5 and then 7 in future years.

In an example experiment, data was analyzed using linear regression to predict the expected number of defects for a given month. For any given month, the number of development hours, number of defects found in system integrations testing (SIT) and number of defects found in user acceptance testing (UAT) were used to predict the number of tickets reported. For the example experiment, the calculation of tickets for the subject organization is base-lined at a severity 4 ticket. In this example, severity 1 is the most severe through severity 5, which is the least severe. However, it should be understood that other manners of categorizing the security levels may be utilized with the disclosed aspects. A single severity 3 ticket is the equivalent of two severity 4 tickets. Similarly, a severity 2 ticket is the equivalent of four severity 4 tickets. Thus, a count of twelve tickets might actually mean: one severity 2 ticket, two severity 3 tickets; and four severity 4 tickets. The prediction came out to be the following where $f$ is a function to predict the number of tickets.

$$f_i = \begin{bmatrix} \text{large } apps >= 1000 devhours, 17.62 + 0.04 * \\ devhours_i - 0.40 * defectsSIT_i + 1.03 * defectsUAT_i \\ \hline \text{small } apps < 1000 devhours, 5.78 + 0.04 * \\ devhours_i - 0.38 * defectsSIT_i + 1.03 * defectsUAT_i \end{bmatrix}$$

The formula for quality is then a percentage above or below the predicted number of tickets. The number is calculated for each application, and then averaged to form the quality score.

After the function $f$ is calculated, the following formulas are used to create the quality scores for each application and then averaged quality score.

$$S_{1_i} = \begin{cases} \text{where } f_i \geq d_i : \frac{f_i - d_i}{f_i} \times 100 \\ \text{where } d_i > f_i : \frac{f_i - d_i}{6\sigma} \times 100 \end{cases},$$

calculate quality score for each app i $$S_1 = \frac{\sum_{i=1}^{n} S_{1_i}}{n},$$

average the quality score where n is the number of apps, $d_i$ is the actual number of tickets for app i, $f$ is the function to predict tickets based upon devhours, defectsSIT, and defectsUAT, $S_1$ is the quality score for app i, and σ for small apps is 82.94; for large apps σ is 180.99.

Example Table 1 below includes fabricated data that will be used to explain the calculation of a quality score.

TABLE 1

| App ID | Month | Dev Hours | Defects SIT | Defects UAT | Tickets |
|---|---|---|---|---|---|
| App 1 | May | 500 | 25 | 7 | 20 |
| App 2 | May | 3000 | 123 | 35 | 145 |

First, the expected number of defects $f_i$ is calculated for each app. It is noted that, in this example, due to the development hours, App 1 is small and App 2 is large.

$f_1$=5.78+0.04*(500)−0.38*(25)+1.03*(7)=23.49

$f_2$=17.62+0.04*(3000)−0.40*(123)+1.03*(35)
=124.47

Now the values for $f$ are compared with the actual tickets reported in order for $S_{1_1}$ and $S_{1_2}$ to be calculated;

$$S_{1_1} = \frac{f_i - d_i}{f_i} \times 100 = \frac{23.49 - 20}{23.49} \times 100 = 14.9$$

$$S_{1_2} = \frac{f_i - d_i}{6\sigma} \times 100 = \frac{124.47 - 145}{6(180.99)} \times 100 = -1.9$$

Finally, the quality scores for the applications are averaged to produce the final quality score.

$$S_1 = \frac{14.9 + -1.9}{2} = 6.5$$

The calculated quality score for the example data would be 6.5 according to this example.

Figure 8:
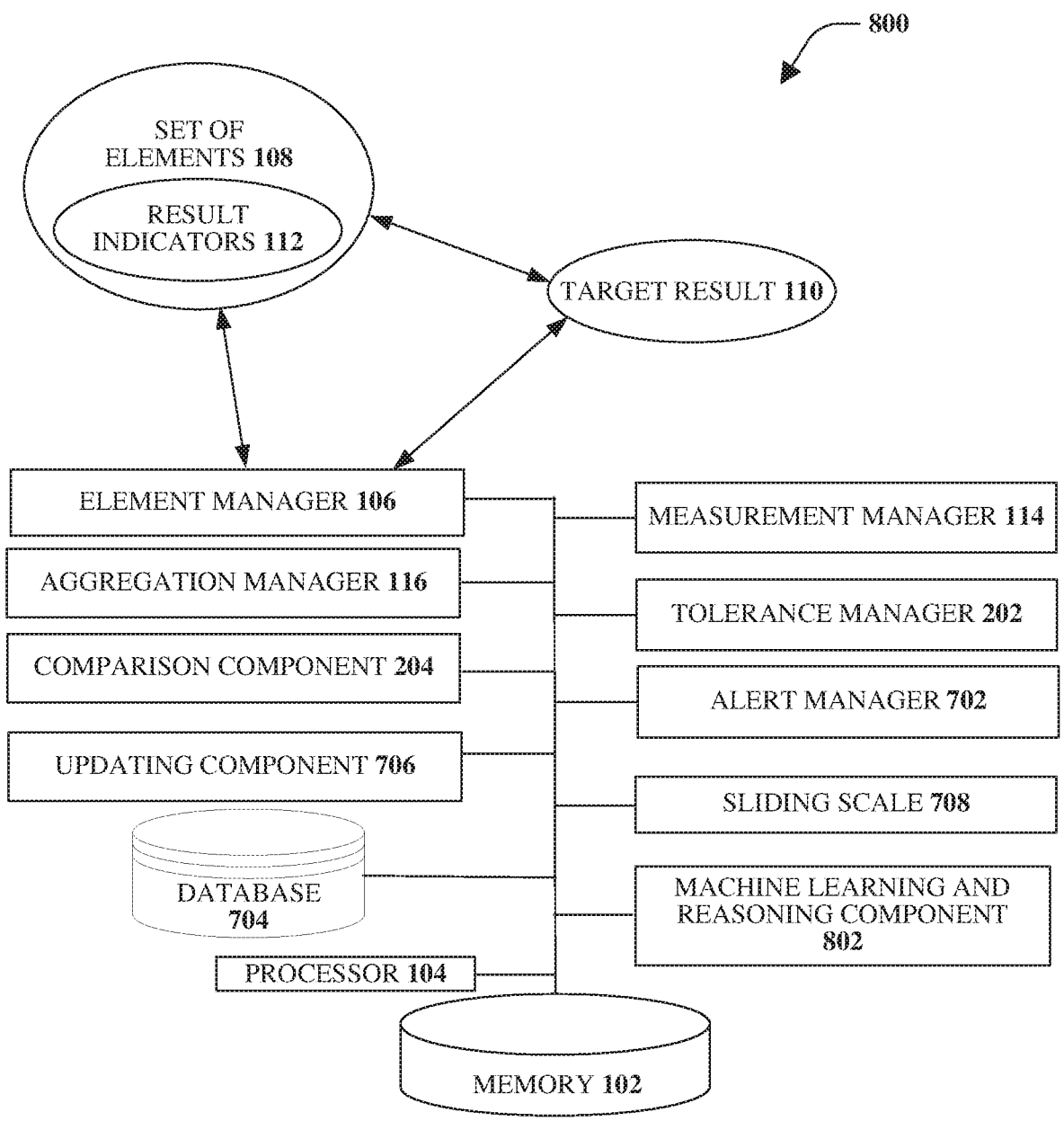
FIG. 8 illustrates an example, non-limiting system that employs automated learning to facilitate one or more of the disclosed aspects.

FIG. 8 illustrates an example, non-limiting system 800 that employs automated learning to facilitate one or more of the disclosed aspects. For example, a machine learning and reasoning component 802 may be utilized to automate one or more of the disclosed aspects. The machine learning and reasoning component 802 may employ automated learning and reasoning procedures (e.g., the use of explicitly and/or implicitly trained statistical classifiers) in connection with performing inference and/or probabilistic determinations and/or statistical-based determinations in accordance with one or more aspects described herein.

For example, the machine learning and reasoning component 802 may employ principles of probabilistic and decision theoretic inference. Additionally or alternatively, the machine learning and reasoning component 802 may rely on predictive models constructed using machine learning and/or automated learning procedures. Logic-centric inference may also be employed separately or in conjunction with probabilistic methods.

The machine learning and reasoning component 802 may infer key attributes, acceptable ranges of the key attributes, a current status of the key attributes, scores for the key attributes, and so on. Based on this knowledge, the machine learning and reasoning component 802 may make an inference based on weighting to be applied to each key attribute, aggregation of scores for the key attributes, a final single score, and so on.

As used herein, the term "inference" refers generally to the process of reasoning about or inferring states of the system, a component, a module, the environment, and/or procedures from a set of observations as captured through events, reports, data, and/or through other forms of communication. Inference may be employed to identify a specific context or action, or may generate a probability distribution over states, for example. The inference may be probabilistic. For example, computation of a probability distribution over states of interest based on a consideration of data and/or events. The inference may also refer to techniques employed for composing higher-level events from a set of events and/or data. Such inference may result in the construction of new events and/or actions from a set of observed events and/or stored event data, whether or not the events are correlated in close temporal proximity, and whether the events and/or data come from one or several events and/or data sources. Various classification schemes and/or systems (e.g., support vector machines, neural networks, logic-centric production systems, Bayesian belief networks, fuzzy logic, data fusion engines, and so on) may be employed in connection with performing automatic and/or inferred action in connection with the disclosed aspects.

The various aspects (e.g., in connection with determining a master performance indicator) may employ various artificial intelligence-based schemes for carrying out various aspects thereof. For example, a process for determining attributes to monitor, a scoring range for each attribute, a weighting factor for each attribute, and so on may be enabled through an automatic classifier system and process.

A classifier is a function that maps an input attribute vector, x=(x1, x2, x3, x4, xn), to a confidence that the input belongs to a class. In other words, f(x)=confidence(class). Such classification may employ a probabilistic and/or statistical-based analysis (e.g., factoring into the analysis utilities and costs) to prognose or infer an action that should be employed to determine what attributes to monitor, tuning each attribute for long-term statistical analysis, implementing a trigger based on an indication of a negative score, providing a sliding scale to adjust quality over time, and so on.

A support vector machine (SVM) is an example of a classifier that may be employed. The SVM operates by finding a hypersurface in the space of possible inputs, which hypersurface attempts to split the triggering criteria from the non-triggering events. Intuitively, this makes the classification correct for testing data that may be similar, but not necessarily identical to training data. Other directed and undirected model classification approaches (e.g., naïve Bayes, Bayesian networks, decision trees, neural networks, fuzzy logic models, and probabilistic classification models) providing different patterns of independence may be employed. Classification as used herein, may be inclusive of statistical regression that is utilized to develop models of priority.

One or more aspects may employ classifiers that are explicitly trained (e.g., through a generic training data) as well as classifiers that are implicitly trained (e.g., by observing process behavior, by receiving extrinsic information, and so on). For example, SVM's may be configured through a learning or training phase within a classifier constructor and feature selection module. Thus, a classifier(s) may be used to automatically learn and perform a number of functions, including but not limited to determining according to a predetermined criteria which result indicators should be used as inputs based on historical data related to a desired result. The criteria may include, but is not limited to, similar inputs, historical information, current information, result indication attributes, and so forth.

Additionally or alternatively, an implementation scheme (e.g., a rule, a policy, and so on) may be applied to control and/or regulate which result indicators to monitor, weighting (if any) to apply to the result indicators, and so on. In some implementations, based upon a predefined criterion, the rules-based implementation may automatically and/or dynamically calculate scores for each result indicator being evaluated. In response thereto, the rule-based implementation may automatically interpret and carry out functions associated with calculating a single final score employing a predefined and/or programmed rule(s) based upon any desired criteria.

Methods that may be implemented in accordance with the disclosed subject matter will be better appreciated with reference to the flow charts. While, for purposes of simplicity of explanation, the methods are shown and described as a series of blocks, it is to be understood and appreciated that the disclosed aspects are not limited by the number or order of blocks, as some blocks may occur in different orders and/or at substantially the same time with other blocks from what is depicted and described herein. Moreover, not all illustrated blocks may be required to implement the disclosed methods. It is to be appreciated that the functionality associated with the blocks may be implemented by software, hardware, a combination thereof, or any other suitable means (e.g. device, system, process, component, and so forth). Additionally, it should be further appreciated that the disclosed methods are capable of being stored on an article of manufacture to facilitate transporting and transferring such methods to various devices. Those skilled in the art will understand and appreciate that the methods might alternatively be represented as a series of interrelated states or events, such as in a state diagram.

Figure 9:
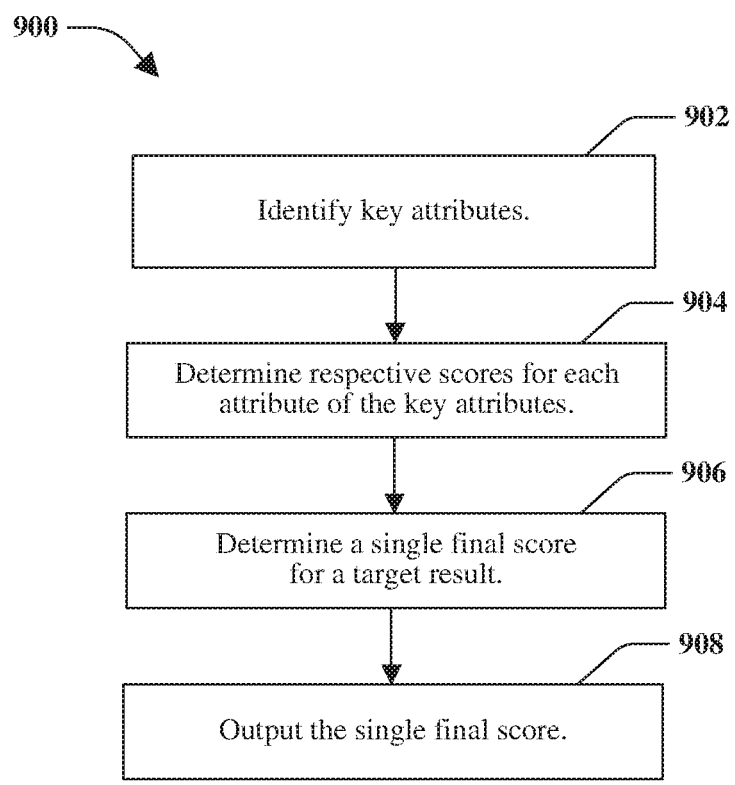
FIG. 9 illustrates an example, non-limiting method for determining a master performance indicator, according to an aspect.

FIG. 9 illustrates an example, non-limiting method 900 for determining a master performance indicator, according to an aspect. The method 900 in FIG. 9 may be implemented using, for example, any of the systems, such as the system 200 (of FIG. 2), described herein. Some processes and/or procedures are metrics driven. When feedback regarding the processes and/or procedures is provided, the feedback may provide information associated with each metric, which may be a large amount of data. Instead of providing this data, it may be more beneficial to provide a digestible set of metrics that are condensed into a single number representative of a group's performance across a multitude of inputs (e.g., input metrics). Further, the single number may be compared to historical data that represents the same information and may indicate trends.

The method 900 begins at 902 when key attributes are defined. The key attributes are dependent on what should be measured to determine effectiveness of a particular process (e.g., to achieve a target result, performance attributes). Thus, the key attributes may be different between two processes (e.g., a first process has a first set of key attribute and the second process has a second set of key attributes). According to some implementations the key attributes may be a set of elements, such as result indicators and/or key result indicators (e.g., what you have done, how you have done it, and so on).

At 904 each of the key attributes are evaluated and respective scores are individually determined for each attribute of the key attributes. Thus, if the key attributes includes a first attribute and at least a second attribute, a first score is determined for the first attribute and at least a second score is determined for at least the second attribute. Similar scores may be utilized for each attribute of the key attributes.

Based on the respective scores, at 906 a single final score is determined for a target result. The single final score may be an aggregate or average of the respective scores of the key attributes. According to some implementations, scores of one or more key attribute may be weighted differently than other scores of other key attributes. However, in some implementations the scores for each attributes of the key attributes are weighted the same (e.g., no weighting is applied). The single final score may be a representation of a predictive analysis of the target result. The predictive analysis provides information related to trends associated with a process and/or with inputs to the process.

At 908, the single final score may be output in an electronic format. For example, the single final score may be output visually, verbally, or in another format. Further, the single final score may be output to devices located remote from each other.

Figure 10:
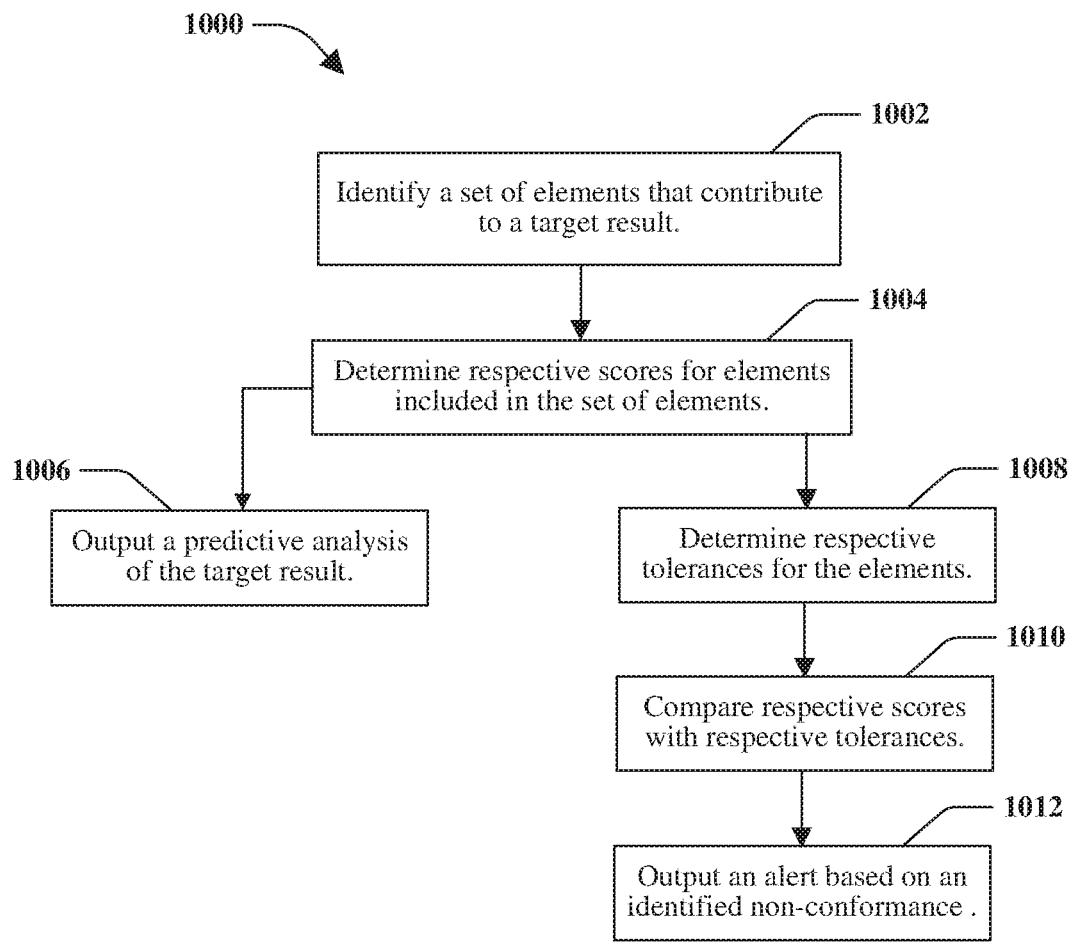
FIG. 10 illustrates an example, non-limiting method for determining a master performance indicator, according to an aspect.

FIG. 10 illustrates an example, non-limiting method 1000 for determining a single final score related to performance, according to an aspect. The method 1000 in FIG. 10 may be implemented using, for example, any of the systems, such as the system 700 (of FIG. 7), described herein. The various aspects discussed herein may aggregate separate values for key attributes into a single value that is representative of the process being reviewed. The single value may provide an evaluation of actual performance associated with the process.

At 1002, a set of elements that contribute to a target result are identified. The set of elements may be related to a process and represent performance attributes. The set of elements may include a first element, a second element, and so on. According to some implementations, the elements are key result indicators defined for the process.

Respective scores for the elements are determined at 1004. For example, a first score may be determined for the first element, a second score determined for the second element, and subsequent scores determined for subsequent elements.

At 1006, a predictive analysis of the target result is output, such as in a perceivable, electronic format. The predictive analysis may be represented as a single final score determined based on a combination of the first score and the second score.

According to an implementation, determining the single final score (e.g., MPI) may include applying a first weight to the first score, a second weight to the second score, and a subsequent weight to the subsequent score. The first score, the second score, and the subsequent score may be aggregated based on the respective weights in order to determine the single final score.

In some implementations, an alert may be output (e.g., transmitted) based on a determination that the single score is above a ceiling threshold level, which may indicate a flaw in an evaluation process. In another implementation, an alert may be output based on another determination that the single score is below a threshold level, which indicates a minimum level of performance.

In an alternative or additional implementation, the method 1000 may include determining, at 1008, a first tolerance for the first element, a second tolerance for the second element, and a subsequent tolerance for the subsequent element. The respective tolerances may be determined based on historical data associated with the associated element.

In some implementations, a tolerance may be adjusted downward based on a determination that an expected event will have a negative impact on the associated element. Alternatively, the tolerance may be adjusted upward based on a determination that another expected event will have a positive impact on the associated element.

At 1010, the first score is compared to the first tolerance, the second score is compared to the second tolerance, and the subsequent score is compared to the subsequent tolerance. Based on the comparison, at 1012, an alert is output based on a determination that the respective score does not conform to the associated tolerance. For example, if the first score does not conform to the first tolerance, the alert is output. In a similar manner, if the second score does not conform to the second tolerance and/or the subsequent score does not conform to the subsequent tolerance, one or more alerts may be output. The alert(s) may be output at about the same time as the predictive analysis of the target result is output, or at a different time.

By way of example and not-limitation, as discussed herein the various aspects may be applied to software development. Each of the inputs utilized to evaluate the software development process (as well as other processes) has its own set of data that should be collected and evaluated for calculating a final, single score. The following will describe the input elements for a software development process in order to more fully describe the disclosed aspects.

Measuring quality is a part of accessing software development results. Poor quality means time, money, and resources are spent fixing the problems. As a result, new features are not being created. A key indicator of software quality is defects. It is beneficial to measure the number of defects associated with a software release because industry-wide the current defect removal rate is only about 85% and this value should be increased to about 95% for high quality software. Organizations are leaving too many defects unfixed. If organizations could lower the number of defects, then not as many defects would need to be fixed, which in turn would raise the defect removal rate.

Another aspect of defects is severity levels. A severity level indicates the importance of a defect that has been discovered. Although an organization may choose whatever severity levels they choose, five severity levels may be utilized according to an example. The most severe level for a defect is 1. All other levels drop in severity from that point. Table 2 below describes the five levels for defect severity.

TABLE 2

| Level | Description |
|---|---|
| 1 | Software is unavailable with no workaround |
| 2 | Software performance degraded with no workaround |
| 3 | Software performance degraded but workaround exists |
| 4 | Software functions but a loss of non-critical functionality |
| 5 | Others: minor cosmetic issue, missing documentation |

In order to properly score the quality of a software development organization, certain data should be obtained in order to measure performance. Table 3 identifies the columns of data that will be used to create a score for the quality element of MPI, in this example. Each column is classified as required or optional. This is to allow some flexibility in the model for organizations that collect varying amounts of data.

TABLE 3

| Column Name | Data Type | |
|---|---|---|
| Application ID | String (factor) | Required |
| Frequency Date | Date | Required |
| Development Effort | Integer | Required |
| Testing Effort | Integer | Optional |
| SIT Defects | Integer | Optional |
| UAT Defects | Integer | Optional |
| PROD Defects | Integer | Optional |

The development and testing effort may come from various choices for effort including, but not limited to, actual time, estimated time, source lines of code, modified lines of code, and test cases. It should be noted that other measures will work for effort although not discussed herein.

The actual time number is a representation of the total amount of time spent on a project. This number may be measured in any unit of time: hours, days, weeks, and so on. Actual time may be applied to development or testing effort.

The estimated time number is a representation of the initial estimated amount of time spent on a project. This number may be measured in any unit of time: hours, days, weeks, and so on. Estimated time may be applied to development or testing effort. It is common for the estimated and actual times to be different.

The source lines of code number is the count of the total number of lines of source code for a project. Obviously, this item only counts as a level of effort for development unless coding in used to generate automated testcases. For example, automated testing is the process of creating software to automatically run tests against other software. The adoption of automated testing is varied and is not a solution in all cases.

The modified lines of code number is a count of the number of modified lines of source code. Modified lines is defined as the number of deleted, added, and modified lines of source code. This number is different from the source lines of code number since the modified lines of code number does not include all the lines of source code. Similar to the source lines of code number, the modified lines of code number makes more sense for development effort.

A test case is a step or series of steps followed to validate some expected outcome of software. Organizations may create a number of testcases to be validated for a software system. The number of such testcases might be used as a level of testing effort.

Notice the data does not include a severity level. The severity level should be handled before being stored. A good technique is to count the defects based upon the weighting scheme in Table 4, which illustrates example defect severity level weighting.

TABLE 4

| Severity Level | Weight |
| --- | --- |
| 1 | 30 |
| 2 | 15 |
| 3 | 5 |
| 4 | 2 |
| 5 | 1 |

For example, finding one defect of severity level 5 will result in a total count of one. However, finding one defect of severity level 2 will result in a total count of 15. This strategy helps to standardize the number of defects found. An organization may alter the values of Table 4 based upon priorities or use a different technique if desired. It may be beneficial to establish a standard, meaningful number for SIT defects, UAT defects, and PROD defects which manages severity appropriately.

A first step in creating a score for the quality element is analysis of the historical data to create a baseline function. The historical data is all quality data collected before a given point in time. Some common historical cutoffs are the current date or the end of the previous fiscal year. Then a mathematical model, called the baseline quality function, to predict PROD Defects will be produced. In statistical terms, the response is PROD Defects and the predictors are: UAT Defects, SIT Defects, Testing Effort, and Development Effort. Some of the following strategies to find a reasonable model include: Removal of outliers and/or influential point, Linear Regression, Stepwise Regression, and Ridge Regression for suspected multicollinearity.

Once a model has been found, it will be labeled as $f$ and it will not change. The function $f$ may be the same for all Application IDs or it may be different for each Application ID or any combination of Application IDs. It serves as the quality baseline for MPI. All future quality scores will be dependent upon the original $f$. Once set, the model does not change.

After the model $f$ has been determined, it is time to calculate the quality score for each application ID within the given time period. The quality score for each Application ID may be calculated as follows:

$$S_{1_i} = \begin{cases} \text{where } f_i \geq d_i : \dfrac{f_i - d_i}{f_i} \cdot k \\ \text{where } d_i > f_i : \dfrac{f_i - d_i}{\sigma_i^2} \cdot k \end{cases},$$

calculate quality score for each app i where $S_1$ is the quality score for Application ID i, k is the scaling factor to produce results in the range $[-k,k]$, n is the number of Application IDs, $d_i$ is the actual PROD defects for Application ID i, $f_i$ is the function to predict PROD defects for Application i based upon UAT Defects, SIT Defects, Testing Effort, and Development Effort, and $\sigma_i^2$ is the estimated variance for Application i Then the overall quality score is calculated as below.

$$S_1 = \sum_{i=1}^{n} w_i S_{1_i}$$

where $S_1$ is the combined quality score for all Application IDs, a weighted average; $w_i > 0$ for all i; and $$\sum_{i=1}^{n} w_i = 1.$$

Then $S_1$ represents the MPI quality score for that given time frequency.

All the new requirements and great quality do not matter if the software is not available. Thus it is essential to set an expected Service Level Agreement (SLA) and measure performance against that SLA. For a software development organization, the SLA is a contract specifying the amount of time software will be available during a given time period. The following section will outline the data needed to properly calculate an SLA and to calculate the MPI score for availability, according to an example.

It is noted that the Service ID for availability does not have to be the same as the Application ID for quality or any of the other elements. Some organizations have a one-to-one mapping between Applications being developed and services being deployed. Others have more complex scenarios that require multiple applications to be combined to form a service. Then the availability of the system is tracked.

Table 5 below identifies the example data that may be used to calculate the MPI element score for availability.

TABLE 5

| Column Name | Data Type | |
|---|---|---|
| Service ID | String | Required |
| Frequency Date | Date | Required |
| Uptime | Float | Optional |
| Scheduled Downtime | Float | Optional |
| Unscheduled Downtime | Float | Optional |
| Percent Uptime | Float | Optional |
| Expected Percent Uptime | Float | Optional |

The three optional fields: Uptime, Scheduled Downtime, and Unscheduled Downtime are optional because they may be used to calculate the Percent Uptime. The Percent Uptime is the value for the MPI schedule score. The following are two approaches that may be used to calculate percent uptime:

First Method:

$$\text{Percent Uptime} = \frac{\text{Uptime}}{\text{Uptime} + \text{Scheduled Downtime} + \text{Unscheduled Downtime}}$$

Second Method:

$$\text{Percent Uptime} = \frac{\text{Uptime}}{\text{Uptime} + \text{Unscheduled Downtime}}$$

The only difference between the first method and the second method is the removal of scheduled downtime from the calculation. The calculation approach may be specified in the contract associated with the SLA. Thus, the Percent Uptime is important and it may either be supplied in the data or calculated from the optional fields. For the purposes of this example, the percent uptime should be handled in decimal form and not as a percent out of 100.

The formula for availability is more straightforward than the quality formula. It does not include any analysis of the historic data. That lack of historical analysis is avoided since the SLA provides an existing baseline to measure against. The following formula is simply a percentage the SLA was exceeded or missed.

$$S_{2_i} = \begin{cases} \text{where } A_{a_i} \leq A_{e_i} : \frac{A_{a_i} - A_{e_i}}{A_{e_i}} \cdot k \\ \text{where } A_{a_i} > A_{e_i} : \frac{A_{a_i} - A_{e_i}}{1 - A_{e_i}} \cdot k \end{cases}$$

calculate quality score for each sys i
where $S_2$ is the availability score for System ID i, k is the scaling factor to produce results in the range [−k, k], $A_{a_i}$ is the actual availability for System ID i, $A_{e_i}$ s the expected availability for System ID i. Then the overall availability score is calculated as:

$$S_2 = \sum_{i=1}^{n} w_i S_{2_i}$$

where $S_2$ is the combined quality score for all Service IDs, a weighted average; $w_i > 0$ for all i, and $$\sum_{i=1}^{n} w_i = 1.$$

Then $S_2$ represents the MPI quality score for that given time frequency.

In this example, the satisfaction of users, customers, and/or business partners is the third element to be measured. This element is important because in an established business, retaining customers is less expensive than attracting new customers. Depending upon the type of software development organization, the customers may be internal or external to the organization. For the remainder of this section, the term customer will be used to represent any person who is responsible for guidance, decision-making or use of the software. The term customer may refer to a: user, paying or nonpaying customer, internal or external business partner, or any other person deemed influential to the development of the software.

According to some implementations, surveys may be used to measure satisfaction for MPI. A series of statements may be presented to all or a subset of the customers. Any customer that chooses to respond to the survey is considered a respondent. A respondent may rate statements with a numerical response where the minimum value indicates maximum disagreement and the maximum value indicates the maximum agreement. Rating scales may be any range, such as from 1 to 5 or from 1 to 3 for example.

In some instances, not every customer may be surveyed and, therefore, sample sets of customers may be presented with a survey. For example, a set of business partners may be presented with the survey. In another example, a probability sample of end-users may be randomly selected to receive the survey.

For this example, Table 6 illustrates data that is being collected from the surveys. This data is used to calculate the satisfaction element score for MPI.

TABLE 6

| Column Name | Data Type | |
|---|---|---|
| Question ID | String | Required |
| Question Text | String | Optional |
| Respondent ID | String | Optional |
| Frequency Date | Date | Required |
| Response | Integer | Required |
| Response Date | Date | Optional |
| Application ID | String | Optional |

After collecting the necessary survey data from Table 6, calculating the score is rather straightforward. The scores for each question are averaged and then those values are averaged together. If some survey questions are more important than others, the formula might be easily modified to include weighting.

The score for each question may be calculated as:

$$S_{3_i} = k \frac{\sum_{j=1}^{m} \left( \frac{2a_{ij} - \min - \max}{\max - \min} \right)}{m}$$

where $S_{3_i}$ is the satisfaction score for Question ID i, k is the scaling factor to produce results in the range [−k, k], $a_{ij}$ is the answer to question i for respondent j, n is the number of questions, m is the number of respondents, min is the minimum score for a question, and max is the maximum score for a question.

Then, the satisfaction score is calculated as follows. Use a weighted average to combine the question scores:

$$S_3 = \sum_{i=1}^{n} w_i S_{3_i}$$

where $S_3$ is the combined satisfaction score for all Question IDs, a weight average; $w_i > 0$ for all $$i, \sum_{i=1}^{n} wi = 1.$$

Then $S_3$ represents the MPI satisfaction score for that given time frequency.

The MPI schedule score provides a numeric value to indicate the amount schedules are missed or exceeded. The score provides a cumulative measure of the performance as compared to other months. The score is based upon the historical deviance of estimates for projects. Projects completing on time will be given a score of 0. Projects finishing early will be rewarded with positive scores increasing toward k. Alternatively, late projects will be given negative scores that approach −k as the projects become more late.

In order to calculate the schedule score, certain dates need to be present. Table 7 outlines example data that may be used for schedules. One date is considered optional as it is not used in the MPI calculation, but it is an important date that might be useful for future enhancements to MPI.

TABLE 7

| Column Name | Data Type | |
|---|---|---|
| Project ID | String | Required |
| Frequency Date | Date | Required |
| Scheduled Start Date | Date | Required |
| Scheduled Finish Date | Date | Required |
| Actual Start Date | Date | Optional |
| Actual Finish Date | Date | Required |

Schedule has a clear date for finishing on-time, however there are not clear bounds as to how early or late a project may be delivered. Thus, the formula for schedule is more involved than availability or satisfaction. It requires some analysis of the historical data. The first step of the formula is determining how often projects are early or late, and by how much a project is early or late. This may be accomplished by looking at the distribution of the data. Specifically, look at what percentage of the entire project duration the schedule was missed.

$$\Delta_i = \frac{F_{a_i} - F_{s_i}}{F_{s_i} - B_{s_i} + 1}$$

where $F_{a_i}$ is the actual finish date of project i, $F_{s_i}$ is the scheduled finish date of project i; $B_{s_i}$ is the scheduled beginning date of project i; and $\Delta_i$ is the proportion the schedule was missed for project i.

Once all the $\Delta_i$'s have been determined, a distribution is fit to the data. Various manners of testing the fit of distribution may be utilized including, histograms, chi-square, Kolmogorov-Smirnov, Shapiro-Wilk, or Anderson-Darling. The distribution is needed for a Cumulative Distribution Function (CDF). The CDF maps the values to a percentile rank within the distribution. The CDF will be transformed to create the schedule score for MPI. Since all CDF functions fall within the range [0, 1], the function needs to be shifted to center around 0, and then doubled to fill the desired range of [−1, 1]. Thus the MPI schedule score for each project becomes the following.

$$S_{4_i} = 2k \cdot \left(CDF(\Delta_i) - \frac{1}{2}\right)$$

where $S_{4_i}$ is the schedule score for Project ID i; k is the scaling factor to produce results in the range [−k, k]. Then the overall schedule score is calculated according to the following equation:

$$S_4 = \sum_{i=1}^{n} w_i S_{4_i}$$

where $S_4$ is the combined schedule score for all Project IDs, a weighted average; $w_i > 0$ for all $$i, \sum_{i=1}^{n} w_i = 1.$$

Then $S_4$ represents the MPI schedule score for that given time frequency.

According to some implementations, an alternative approach for scoring schedule may be utilized. According to this alternative approach, the best possible score should be achieved when meeting the estimated date exactly. The maximum score should come from the best estimate. Then given historical release data, it is easy to determine an average L between the actual and the estimated. Finishing a project within that L should result in a positive score. Outside the L results in negative scores. For example, a project releasing one day early or one day late would receive the same score because in both cases the estimate was missed by one day.

The first step of the formula is finding the percentage the schedules were missed for historical projects. The calculation treats over- and under-estimating the schedule the same. The same penalty is applied in both cases. For example, being 15% late will result in the same score as being 15% early. Perform this calculation only for projects that did not exactly meet the estimated finish date.

$$\Delta_i = \left|\frac{F_{a_i} - F_{s_i}}{F_{s_i} - B_{s_i} + 1}\right|$$

Find the average of the $\Delta_i$'s. This is the average proportion of a missed schedule.

$$\overline{\Delta} = \frac{\sum_{i=1}^{n} \Delta_i}{n}$$

The formula for schedule is then a percentage above or below the L. The number is calculated for each project, and then averaged to form the schedule score.

$$S_{4_i} = \begin{cases} \text{where } \Delta_i \geq 1 : -1 \cdot k \\ \text{where } \Delta_i \leq \overline{\Delta} : \dfrac{\overline{\Delta} - \Delta_i}{\overline{\Delta}} \cdot k \\ \text{where } \Delta_i > \overline{\Delta} : \dfrac{\overline{\Delta} - \Delta_i}{1 - \overline{\Delta}} \cdot k \end{cases},$$

calculate schedule score for each project i $$S_4 = \sum_{i=1}^{n} w_i S_{4_i}$$

where $S_4$ is the combined schedule score for all Project IDs, a weighted average; k is the scaling factor to produce results in the range [−k,k]; $w_i$>0 for all $$i, \sum_{i=1}^{n} w_i = 1;$$

n is the number of projects; $F_{a_i}$ is the actual finish date of project i; $F_{S_i}$ is the scheduled finish date of project i; $B_{S_i}$ is the scheduled beginning data of project i; $A_i$ is the percent the schedule was missed; $\overline{\Delta}$ is the average percent schedules are missed; $S_4$ is the schedule score for project i. Then $S_4$ represents the MPI schedule score for that given time frequency.

The requirements of an SDO are important. Requirements are desired new features or enhancements to a software product. It is important to know how many requirements were scheduled to be completed versus how many actually got completed. They provide a measurement of the amount of work being completed. However, not all requirements are created equal. Some requirements may be quickly and easily implemented while other requirements will take much longer. It is often difficult to know the challenges ahead of time. Due to this uncertainty, estimating the number of requirements a team may complete in a given time frame may be difficult. Thus, the number of requirements is one way to measure amount of work but there are others.

A requirement choice may be one or more function points, which measure the size of the software functionality, not the size or time needed to implement the functionality. The functions points may provide a concise measurement for the amount of working being completed. Another requirement choice may be story points (of simply "stories"), which are broken down requirements. A story is usually smaller, simpler, and more concise than a plan requirement. A further requirement choice may be requirements that are defined by the users or business partners. Each requirement may vary greatly from another requirement.

Table 8 illustrates example data required to compute a score for the requirements elements of MPI.

TABLE 8

| Column Name | Data Type | |
|---|---|---|
| Project ID | String | Required |
| Frequency Date | Date | Required |
| Scheduled Requirements | Integer | Required |
| Actual Requirements | Integer | Required |

It is noted that scheduled requirements and actual requirements may also be a count of story points or function points. In Table 8, all of the columns are required. The data collected is the frequency date and then the number of requirements scheduled to be completed and the actual number of requirements completed.

The requirements formula is the percentage above or below the scheduled number of requirements. Requirements have a nice lower bound of 0 since negative requirements cannot be completed (e.g., might be considered a defect). Unfortunately, an upper bound does not exist. The variability of requirements is not as large as the variability of the number of defects, so a simpler strategy may be used. For requirements, a multiplier b will be used to find the upper bound. The number of scheduled requirements should be multiplied by b to obtain the upper bound. The value of b should be determined by looking at the historical data to make sure no number of completed requirements will exceed b times the number of scheduled requirements. In an example, choices for b may be 1 and 2. Also, the formula will be created to deal with a value going above the upper bound.

$$S_{5_i} = \begin{cases} \text{where } R_{a_i} > R_{s_i} \cdot (b+1) : 1 \cdot k \\ \text{where } R_{a_i} \leq R_{s_i} : \dfrac{R_{a_i} - R_{s_i}}{R_{s_i}} \cdot k \\ \text{where } R_{a_i} > R_{s_i} : \dfrac{R_{a_i} - R_{s_i}}{b \cdot R_{s_i}} \cdot k \end{cases},$$

requirements score for project i
where $S_{5_i}$ is the requirements score for Project ID i; k is the scaling factor to produce results in the range [−k, k]; $R_{a_i}$ is the actual requirements completed for Project ID i; $R_{S_i}$ is the expected requirements completed for Project ID i; and b is the multiplier to determine the upper bound. Then the requirements score is calculated per the following equation. Use a weighted average to combine the requirements scores from the Project IDs.

$$S_5 = \sum_{i=1}^{n} w_i S_{5_i}$$

where, $S_5$ is the combined requirements score for all Project IDs, a weighted average; $w_i$>0 for all i, and $$\sum_{i=1}^{n} w_i = 1.$$

Then $S_5$ represents the MPI requirement scores for that given time frequency.

In order to accomplish the single number score that MPI requires, the five element scores are combined. The combination of the scores is a weighted average. The weights may be set based upon the priority of the software development organization. Thus, the overall MPI score is calculated according to the following equation.

$$MPI = \sum_{i=1}^{n} w_i S_i \text{ where } \sum_{i=1}^{n} w_i = 1$$

where MPI is the overall MPI score the time frequency.

In some implementations, it is possible that two or more of the five elements of MPI will be correlated. This means that one of the elements may be predicted based upon the values of the other elements. Although it is possible for correlation to occur between any of the elements, the satisfaction element is an obvious element which deserves attention due to the human involvement of the surveys. If a schedule is missed or an important requirement dropped, that might have a large negative effect on the satisfaction surveys. The same might be said of quality or availability with regard to the satisfaction. However, satisfaction is not the only potentially correlated element. It is also possible that a decrease in quality might result in unexpected downtime which might have a negative result on availability. Similarly, if requirements are added, it is possible the schedule will be negatively impacted. Also, if requirements are dropped, the quality might suffer due to missing functionality.

It is impossible to know which or if correlations will always exist. Thus it is necessary to check for correlations after determining element and overall MPI scores. If an element is determined to be correlated with another element, neither element should be dropped, but rather one of the elements should be weighted less than the other correlated element. This technique keeps the most data available but lessens the importance of the correlated element.

The sensitivity of the formulas should be tested to ensure that the scores should not fluctuate drastically for similar values. There are various manners for testing the sensitivity of the formulas as will be described below.

Given the historical data that has been collected, alter the values by a small random amount. Then recalculate the MPI element score and compare with the original score. This technique may be repeated many times in order to verify small changes do not largely affect the score. Thus, a formula which is not overly sensitive.

Another technique is to use Monte Carlo methods to randomly generate input values for the element functions. This may be done by finding the distributions of the historical data, and randomly selecting from that distribution. If historical data is not available, then the normal distribution may be used.

Figure 11:
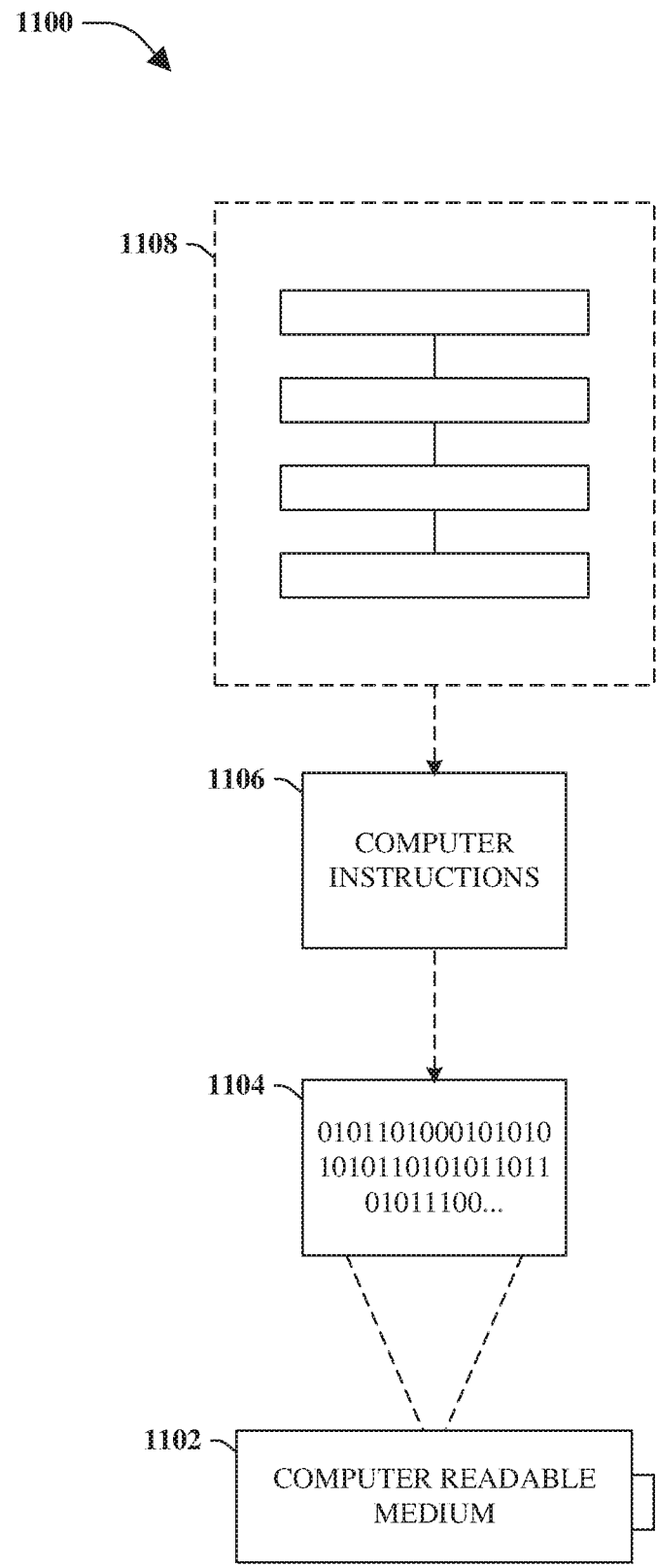
FIG. 11 illustrates an example, non-limiting computer-readable medium or computer-readable device including processor-executable instructions configured to embody one or more of the aspects set forth herein.

One or more implementations include a computer-readable medium including microprocessor or processor-executable instructions configured to implement one or more embodiments presented herein. As discussed herein the various aspects enable identification of anomalous transaction attributes in real-time with adaptive threshold tuning. An embodiment of a computer-readable medium or a computer-readable device devised in these ways is illustrated in FIG. 11, wherein an implementation 1100 includes a computer-readable medium 1102, such as a CD-R, DVD-R, flash drive, a platter of a hard disk drive, and so forth, on which is encoded computer-readable data 1104. The computer-readable data 1104, such as binary data including a plurality of zero's and one's as illustrated, in turn includes a set of computer instructions 1106 configured to operate according to one or more of the principles set forth herein.

In the illustrated embodiment 1100, the set of computer instructions 1106 (e.g., processor-executable computer instructions) may be configured to perform a method 1108, such as the method 1000 of FIG. 10 and/or the method 1100 of FIG. 11, for example. In another embodiment, the set of computer instructions 1106 may be configured to implement a system, such as the system 200 of FIG. 2 and/or the system 700 of FIG. 7, for example. Many such computer-readable media may be devised by those of ordinary skill in the art that are configured to operate in accordance with the techniques presented herein.

As used in this application, the terms "component", "module," "system", "interface," "manager," and the like are generally intended to refer to a computer-related entity, either hardware, a combination of hardware and software, software, or software in execution. For example, a component may be, but is not limited to being, a process running on a processor, a processor, an object, an executable, a thread of execution, a program, or a computer. By way of illustration, both an application running on a controller and the controller may be a component. One or more components residing within a process or thread of execution and a component may be localized on one computer or distributed between two or more computers.

Further, the claimed subject matter may be implemented as a method, apparatus, or article of manufacture using standard programming or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, many modifications may be made to this configuration without departing from the scope or spirit of the claimed subject matter.

FIG. 11 and the following discussion provide a description of a suitable computing environment to implement embodiments of one or more of the aspects set forth herein. The operating environment of FIG. 11 is merely one example of a suitable operating environment and is not intended to suggest any limitation as to the scope of use or functionality of the operating environment. Example computing devices include, but are not limited to, personal computers, server computers, hand-held or laptop devices, mobile devices, such as mobile phones, Personal Digital Assistants (PDAs), media players, and the like, multiprocessor systems, consumer electronics, mini computers, mainframe computers, distributed computing environments that include any of the above systems or devices, etc.

Generally, embodiments are described in the general context of "computer readable instructions" being executed by one or more computing devices. Computer readable instructions may be distributed via computer readable media as will be discussed below. Computer readable instructions may be implemented as program modules, such as functions, objects, Application Programming Interfaces (APIs), data structures, and the like, that perform one or more tasks or implement one or more abstract data types. Typically, the functionality of the computer readable instructions are combined or distributed as desired in various environments.

Figure 12:
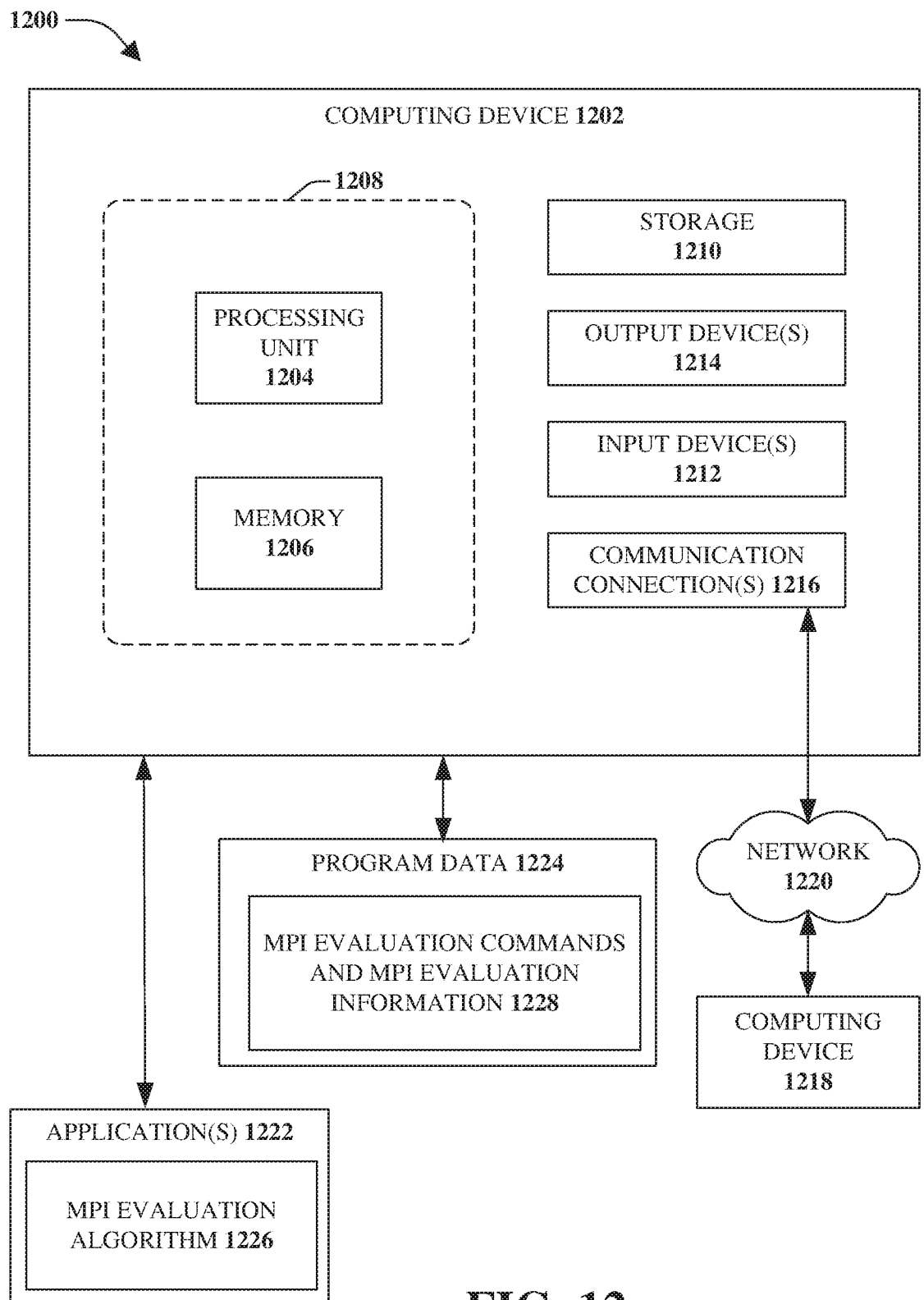
FIG. 12 illustrates an example, non-limiting computing environment where one or more of the aspects set forth herein are implemented, according to one or more aspects.

FIG. 12 illustrates a system 1200 that may include a computing device 1202 configured to implement one or more embodiments provided herein. In one configuration, the computing device 1202 may include at least one processing unit 1204 and at least one memory 1206. Depending on the exact configuration and type of computing device, the at least one memory 1206 may be volatile, such as RAM, non-volatile, such as ROM, flash memory, etc., or a combination thereof. This configuration is illustrated in FIG. 12 by dashed line 1208.

In other embodiments, the computing device 1202 may include additional features or functionality. For example, the computing device 1202 may include additional storage such as removable storage or non-removable storage, including, but not limited to, magnetic storage, optical storage, etc. Such additional storage is illustrated in FIG. 12 by storage 1210. In one or more embodiments, computer readable instructions to implement one or more embodiments provided herein are in the storage 1210. The storage 1210 may store other computer readable instructions to implement an operating system, an application program, etc. Computer readable instructions may be loaded in the at least one memory 1206 for execution by the at least one processing unit 1204, for example.

Computing devices may include a variety of media, which may include computer-readable storage media or communications media, which two terms are used herein differently from one another as indicated below.

Computer-readable storage media may be any available storage media, which may be accessed by the computer and includes both volatile and nonvolatile media, removable and non-removable media. By way of example, and not limitation, computer-readable storage media may be implemented in connection with any method or technology for storage of information such as computer-readable instructions, program modules, structured data, or unstructured data. Computer-readable storage media may include, but are not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or other tangible and/or non-transitory media which may be used to store desired information. Computer-readable storage media may be accessed by one or more local or remote computing devices (e.g., via access requests, queries or other data retrieval protocols) for a variety of operations with respect to the information stored by the medium.

Communications media typically embody computer-readable instructions, data structures, program modules, or other structured or unstructured data in a data signal such as a modulated data signal (e.g., a carrier wave or other transport mechanism) and includes any information delivery or transport media. The term "modulated data signal" (or signals) refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

The computing device 1202 may include input device(s) 1212 such as keyboard, mouse, pen, voice input device, touch input device, infrared cameras, video input devices, or any other input device. Output device(s) 1214 such as one or more displays, speakers, printers, or any other output device may be included with the computing device 1202. The input device(s) 1212 and the output device(s) 1214 may be connected to the computing device 1202 via a wired connection, wireless connection, or any combination thereof. In one or more embodiments, an input device or an output device from another computing device may be used as the input device(s) 1212 and/or the output device(s) 1214 for the computing device 1202. Further, the computing device 1202 may include communication connection(s) 1216 to facilitate communications with one or more other devices, illustrated as a computing device 1218 coupled over a network 1220.

One or more applications 1222 and/or program data 1224 may be accessible by the computing device 1202. According to some implementations, the application(s) 1222 and/or program data 1224 are included, at least in part, in the computing device 1202. The application(s) 1222 may include a MPI evaluation algorithm 1226 that is arranged to perform the functions as described herein including those described with respect to the system 800 of FIG. 8. The program data 1224 may include MPI evaluation commands and MPI evaluation information 1228 that may be useful for operation with the various aspects as described herein.

Although the subject matter has been described in language specific to structural features or methodological acts, it is to be understood that the subject matter of the appended claims is not necessarily limited to the specific features or acts described above. Rather, the specific features and acts described above are disclosed as example embodiments.

Various operations of embodiments are provided herein. The order in which one or more or all of the operations are described should not be construed as to imply that these operations are necessarily order dependent. Alternative ordering will be appreciated based on this description. Further, not all operations may necessarily be present in each embodiment provided herein.

As used in this application, "or" is intended to mean an inclusive "or" rather than an exclusive "or." Further, an inclusive "or" may include any combination thereof (e.g., A, B, or any combination thereof). In addition, "a" and "an" as used in this application are generally construed to mean "one or more" unless specified otherwise or clear from context to be directed to a singular form. Additionally, at least one of A and B and/or the like generally means A or B or both A and B. Further, to the extent that "includes", "having", "has", "with", or variants thereof are used in either the detailed description or the claims, such terms are intended to be inclusive in a manner similar to the term "comprising".

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel. Additionally, "comprising," "comprises," "including," "includes," or the like generally means comprising or including.

Although the disclosure has been shown and described with respect to one or more implementations, equivalent alterations and modifications will occur based on a reading and understanding of this specification and the annexed drawings. The disclosure includes all such modifications and alterations and is limited only by the scope of the following claims.

What is claimed is:

1. A system, comprising:
a processor;
a memory that stores executable instructions that, when executed by the processor, facilitate performance of operations, comprising:
determining, according to predetermined criteria, a set of elements that contribute to a target result associated with a software development process of a software development group, the set of elements are related to the software development process and represent performance attributes of the software development process, wherein the set of elements are result indicators and include a first element and a second element;

determining a first score for the first element and second score for the second element;

invoking a support vector machine configured through a training phase to automatically learn via predetermined criteria to classify the first element and the second element as a result indicator or a key result indicator and to determine whether a result indicator or a key result indicator should be used as an input based on historical data related to a desired result, wherein the predetermined criteria includes at least one of similar inputs, historical data, and current data;

applying a first weight to the first score and a second weight to the second score based upon the classification of the first element and the second element;

calculating a single final score based on a combination of the first score, the second score, the first weight, and the second weight;

outputting in an electronic format a predictive analysis that represents an indicator of performance of the target result, wherein the predictive analysis is represented as the calculated single final score, wherein the single final score is indicative of an overall performance level of the software development process of the software development group; and generating an alert if the single final score is below a predefined threshold level or is projected to fall below the predefined threshold level, wherein the threshold level indicates a minimum level of acceptable performance.

2. The system of claim 1, the operations further comprise:

determining a first tolerance for the first element and a second tolerance for the second element;

comparing the first score with the first tolerance and the second score with the second tolerance; and outputting an alert based on a determination that the first score does not conform to the first tolerance or another determination that the second score does not conform to the second tolerance.

3. The system of claim 2, the operations further comprise determining the first tolerance and the second tolerance based on the historical data associated with the first element and the second element.

4. The system of claim 2, the operations further comprise adjusting the first tolerance downward based on another determination that an expected event will have a negative impact on the first element.

5. The system of claim 2, the operations further comprise adjusting the first tolerance upward based on another determination that an expected event will have a positive impact on the first element.

6. The system of claim 1, wherein the operations further comprise adjusting at least one expectation based on an event expected to occur, wherein the at least one expectation is associated with the first element, the second element, or both the first element and the second element.

7. The system of claim 6, wherein the operations further comprise adjusting a sliding scale associated with a performance measurement for the first element or another performance measurement for the second element.

8. The system of claim 6, wherein the first weight is different from the second weight.

9. The system of claim 6, wherein the first element and the second element are key result indicators defined for the process.

10. The system of claim 6, the operations further comprise:

defining a ceiling threshold level for the first element; and outputting an error based on a determination that a score for the first element is above the ceiling threshold level.

11. The system of claim 6, the operations further comprise:

determining a sliding scale for a value associated with the first element; and adjusting the sliding scale for the value to an increased value based on a determination that an expectation for the first element is increased.

12. The system of claim 6, wherein the first element and the second element are selected from quality, availability, satisfaction, schedule adherence, or requirements.

* * * * *